United States Patent
Murakami et al.

(10) Patent No.: US 7,178,419 B2
(45) Date of Patent: Feb. 20, 2007

(54) CONTROL DEVICE WITH SHIFT POSITION DETECTOR, AND POWER TRAIN WITH THE CONTROL DEVICE

(75) Inventors: Naotaka Murakami, Anjo (JP); Naoto Ogasawara, Anjo (JP); Kenji Suzuki, Anjo (JP); Atsushi Fukuta, Anjo (JP); Jun Takamatsu, Anjo (JP)

(73) Assignee: Aisin AW Co., Ltd., Anjo (JP)

( * ) Notice: Subject to any disclaimer, the term of this patent is extended or adjusted under 35 U.S.C. 154(b) by 75 days.

(21) Appl. No.: 10/489,107

(22) PCT Filed: Mar. 27, 2003

(86) PCT No.: PCT/JP03/03865

§ 371 (c)(1),
(2), (4) Date: Sep. 27, 2004

(87) PCT Pub. No.: WO03/081087

PCT Pub. Date: Oct. 2, 2003

(65) Prior Publication Data

US 2005/0028624 A1 Feb. 10, 2005

(30) Foreign Application Priority Data

Mar. 27, 2002 (JP) .............................. 2002-090011
Mar. 27, 2002 (JP) .............................. 2002-090012

(51) Int. Cl.
*F16H 59/00* (2006.01)
*H01H 9/06* (2006.01)

(52) U.S. Cl. ..................................... 74/335; 200/61.88

(58) Field of Classification Search ................. 74/335, 74/473.12; 307/10.1; 200/61–88
See application file for complete search history.

(56) References Cited

U.S. PATENT DOCUMENTS

| | | | | | |
|---|---|---|---|---|---|
| 4,790,204 | A | * | 12/1988 | Tury et al. .............. | 74/483 PB |
| 5,064,975 | A | * | 11/1991 | Boucher .................. | 200/61.88 |
| 5,101,677 | A | | 4/1992 | Hammerschmitt .......... | 74/335 |
| 5,161,422 | A | * | 11/1992 | Suman et al. .............. | 74/335 |
| 5,791,432 | A | | 8/1998 | Fushimi et al. ............. | 180/412 |
| 5,811,747 | A | * | 9/1998 | Taniguchi et al. ....... | 200/61.88 |
| 5,847,344 | A | * | 12/1998 | Denyer et al. ........... | 200/61.88 |
| 6,155,856 | A | | 5/2000 | Sanada ....................... | 439/246 |
| 6,144,273 | A | | 11/2000 | Satoh et al. ................ | 335/207 |
| 6,931,957 | B2 | * | 8/2005 | Saito et al. ................. | 74/335 |

FOREIGN PATENT DOCUMENTS

| | | |
|---|---|---|
| JP | 61-159795 | 7/1986 |
| JP | 5-95175 | 4/1993 |
| JP | 5-196130 | 8/1993 |
| JP | 8-51019 | 2/1996 |
| JP | 44-31890 | 2/1999 |
| JP | 2001-214773 | 8/2001 |

* cited by examiner

*Primary Examiner*—Dirk Wright
(74) *Attorney, Agent, or Firm*—Bacon & Thomas, PLLC

(57) ABSTRACT

A control apparatus includes a shift position detecting device for detecting a shift position that is changed by manual operation of the vehicle driver, an ECU for controlling an A/T based on a signal for a detected vehicle running state, and connectors that connect to an electrical unit outside the casing. Further, the shift position detecting device, the connectors, and the electronic control unit are electrically connected through a connecting board. Consequently, the shift position detecting device, the ECU, and the connectors can be freely laid out.

74 Claims, 15 Drawing Sheets

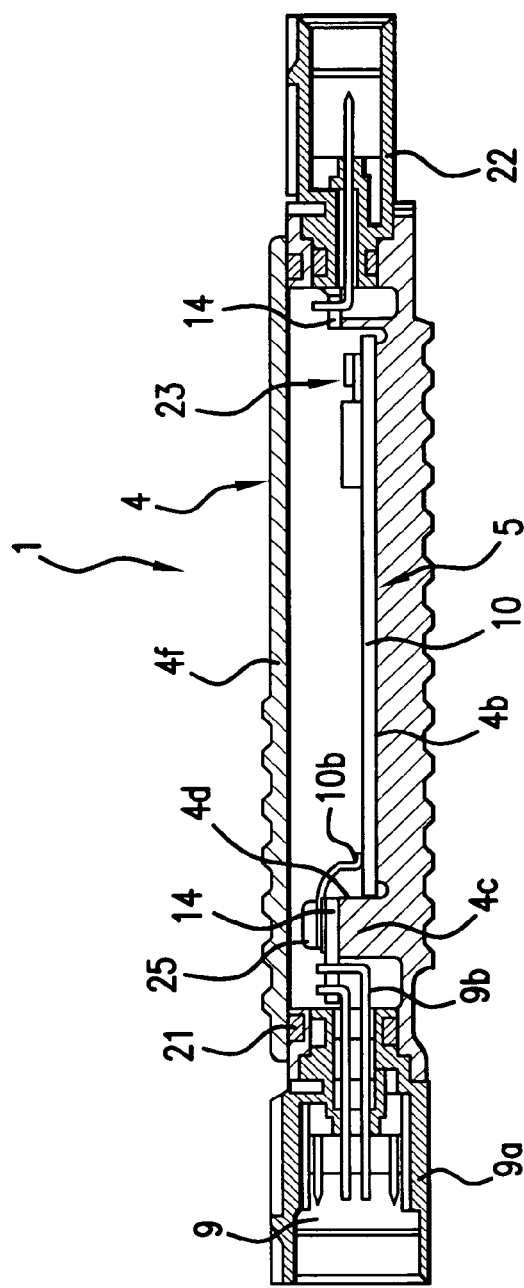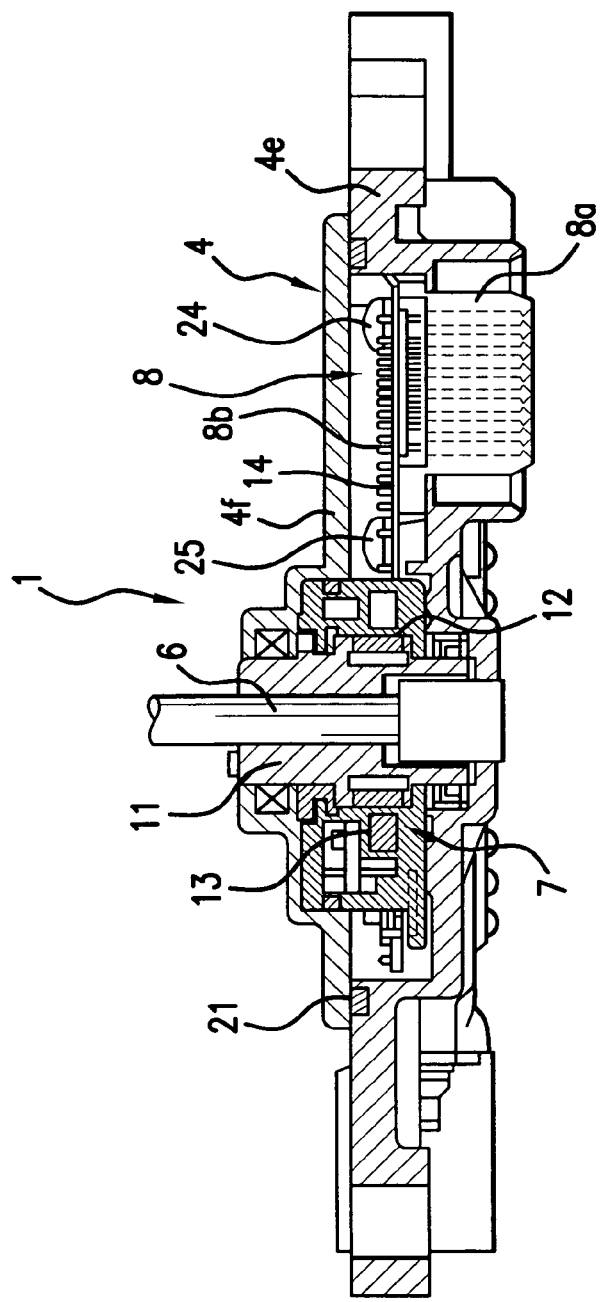

CONTROL DEVICE WITH SHIFT POSITION DETECTOR, AND POWER TRAIN WITH THE CONTROL DEVICE

CROSS-REFERENCE TO RELATED APPLICATIONS

This application is a National Phase Application (35 USC 371) of PCT/JP03/03865 and claims priority of Japanese Application No. 2002-090011 filed Mar. 27, 2002 and Japanese Application No. 2002-090012 filed Mar. 27, 2002.

BACKGROUND OF THE INVENTION

1. Field of the Invention

The present invention relates to a control apparatus for a power train which includes, integrated within a casing, a shift position detecting device for detecting a shift position that is changed in accordance with operation by the driver, an electronic control unit (hereinafter referred to as the "ECU") for controlling the power train based on at least a detection signal representing a vehicle running state, and a connector for connecting to an electrical unit outside the casing. The term "power train" as used herein refers to an engine as a driving unit, an automatic transmission (hereinafter, also referred to as "A/T") which automatically executes a starting operation or gear shifting operation, a semi-automatic transmission in which the starting operation is automated while the gear shifting operation is carried out manually, a continuously variable transmission which is capable of varying the speed stage over a continuum, the combination of an internal combustion engine and electric motor in a hybrid drive train, or a motor for driving an electric vehicle.

2. The Related Art

The vehicle-mounted A/T, which is one such power train, is controlled by operation of a shift unit including a hydraulic controller responsive to an operation by the driver, and by an ECU for controlling the A/T in accordance with a vehicle running condition detection signal. The ECU is mounted within a vehicle compartment or an engine compartment, and a neutral start switch (hereinafter referred to as the "N switch") and a position sensor, which are electric devices used for control, are located outside the A/T case, while sensors for engine speed and oil temperature, solenoids and other devices are in general disposed within the A/T case. Accordingly, the respective electric devices and the ECU are electrically connected through a wire harness.

FIG. 15 is a diagram showing schematically and conceptually the electric connection between various electric devices and the ECU in a conventional A/T. As shown in FIG. 15, wiring of the various sensors in the A/T case (not shown) is gathered together by a wire harness a, which is wiring internal to the A/T case and extending therethrough to outside the A/T case. Furthermore, wirings b for solenoids provided in a valve body within the A/T case extend out of the A/T case individually, and wiring d of an N-switch integrated position sensor (shift position detecting sensor) c provided on an outer face of the A/T case is directly connected to an ECU f through a wire harness e.

In a wiring structure such as shown in FIG. 15, a number of wire harnesses and connectors are necessary for electric connection, so that they not only add to the weight, but also to the cost and, furthermore, require time for mounting design and vehicle installation.

For the foregoing reason, Japanese Patent Application Laid-Open No. HEI 5-196130 proposes simplification of the wiring structure by integrating the shift position detecting sensor with the ECU. According to this patent publication, complicated harness connections can be eliminated and production costs can be reduced, thereby improving mountability.

Incidentally, because the shift position detecting sensor and the ECU have different mounting positions and connector positions depending on the A/T, the layouts thereof are required to be easily and flexibly changeable to correspond to the A/T with which they are to be used.

However, in the integrated structure of the shift position detecting sensor and the ECU disclosed in the aforementioned patent publication, it is difficult to change the layout easily and flexibly to correspond to the A/T with which it is to be mounted. In particular, since, in the integrated structure in the aforementioned patent publication, a fixed contact of the shift position detecting sensor and a circuit board of the ECU are on a single common board, it is extremely difficult to change the layout flexibly to correspond to the A/T with which it is to be mounted.

Because the ECU with the shift position detecting device, in which such a shift position detecting sensor is integrated, is installed and fixed on an outer face of the A/T case, since the A/T is disposed within the engine compartment, the ECU with the shift position detecting device is also disposed within the engine compartment. The engine compartment accommodates not only an engine but also various other devices, so that installation space for the ECU with the shift position detecting device is limited to an extremely narrow space. Therefore, the ECU with the shift position detecting device is required to be formed as compactly as possible so as not to interfere with other the devices in the engine compartment. However, with the integrated structure of the shift position detecting sensor and the ECU disclosed in the aforementioned patent publication, no special consideration has been paid to compactness, and it cannot be said that measures were taken to form the ECU with the shift position detecting device as compactly as possible.

Further, because the shift position detecting sensor and the ECU each have various different shapes, if the shift position detecting sensor is integrated with the ECU, the integrated structure of the shift position detection sensor and the ECU is required to be easily and flexibly changeable to achieve as much compactness as possible.

However, with the integrated structure of the shift position detecting sensor and the ECU disclosed in the aforementioned patent publication, it is difficult to change the integrated structure to correspond to the respective shapes of the shift position detecting sensor and the ECU. In particular, since, in the integrated structure in the aforementioned patent publication, the fixed contact of the shift position detecting sensor and the circuit board of the ECU are mounted on a single common board, it is extremely difficult to change the integrated structure to correspond to the respective shapes of the shift position detecting sensor and the ECU.

Additionally, if an apparatus in which the shift position detecting sensor is integrated with the ECU is installed, for example, on an outer face of the A/T case within the engine compartment or within a valve body of the A/T, it is necessary to protect the ECU from severe heat within the engine compartment and from heat generated from a plurality of devices mounted on the control board of the ECU, to ensure accurate operation of the ECU. Thus, the control board of the ECU must be formed of a material having a high heat dissipation capacity and heat resistance.

In the integrated structure disclosed in the aforementioned patent publication, it is unavoidable that material having a high heat dissipation capacity and heat resistance must be used. In other words, since processing is not easy, it becomes necessary that a single common board be used that forms the fixed contact of the shift position detecting sensor and the ECU. If such a difficult to process material is employed as the board of the aforementioned integrated structure, it is extremely difficult to change it easily and flexibly, to correspond to the respective shapes of the shift position detecting sensor and the ECU. Therefore, a problem of dead space in the casing which accommodates the shift position detecting sensor and the ECU is created.

Furthermore, if it is extremely difficult to make the shape of such a single common board correspond to the respective shapes of the shift position detecting sensor and the ECU, it is difficult to electrically connect the shift position detecting device to the control unit flexibly and securely in accordance with the shape of the shift position detecting device or the shape of the control unit.

Further, the engine compartment accommodates not only an engine but also various other kinds of devices, and therefore the ECU installation space in which the ECU with the shift position detecting device is fixed is limited to a very small space. Therefore, the above-described ECU with the integrated shift position detecting device and shift position detecting sensor is required to be as compact as possible so as not to interfere with the other devices in the engine compartment. However, no special attention has been paid to such a requirement for compactness, and therefore it cannot be said that the ECU and shift position detecting device have been made sufficiently compact.

SUMMARY OF THE INVENTION

Accordingly, an object of the present invention is to provide a control apparatus with a shift position detecting device capable of being easily and flexibly adapted to any power train with which it is to be mounted.

Another object of the present invention is to provide a control apparatus with a shift position detecting device in which a board of a control unit thereof is capable of being easily and flexibly adapted to the shape of the shift position detecting device.

Still another object of the present invention is to provide a combination of a control apparatus with a shift position detecting device and a power train, which is capable of being easily and flexibly adapted to the shape of at least one of the shift position detecting device, the control unit and the connector portion.

Yet another object of the present invention is to provide power trains provided with these control and shift position detecting devices.

To achieve the aforementioned objects, the control apparatus with a shift position detecting device according to the present invention includes a shift position detecting device for detecting a shift position that is manually changed by the driver, an electronic control unit for controlling the power train based on a detection signal for at least a vehicle running state, and a connector portion that connects to an external electrical unit, wherein at least one of the shift position detecting device and the connector portion is connected electrically to the control unit through a connecting board.

The control apparatus according to the present invention may further include a control board on which a plurality of devices are disposed, with the shift position detecting device electronically connected to the control board through the connecting board.

The control board is preferably formed of a material having a higher heat dissipation capacity than the connecting board and, preferably, also having a higher heat resistance than the connecting board. The control board may be formed of a less expensive material than that of the connecting board, and/or easier to process than that of the connecting board. Preferably, the control board is a ceramic board. Alternatively, a glass cloth epoxy board having a high heat dissipation capacity and high heat resistance is employed for the control board, which is cheaper than a board made out of ceramic, and a reduction in cost is thereby achieved.

The control board may conform to the shape of the shift position detecting device. For example, the shift position detecting device may have a circular section orthogonal to its central axis, in which case the control board is formed with an external shape having a curvature that conforms to the circular section.

The material of the connecting board may be flexible. A preferred material for the connecting board is a glass cloth epoxy board which has both a high heat dissipative capacity and high heat resistance. Alternatively, the connecting board may be fabricated of an easy to process material to facilitate the connecting of the connecting board to the shift position detecting device or the control unit in accordance with the shape of the shift position detecting device or the shape of the control unit. Therefore, flexibility in making secure electrical connections is enhanced, regardless of the shape of the shift position detecting device or the shape of the control unit. In particular, where the connecting board is fabricated of a material which is easier to process than that of the control board, regardless of the shapes of the shift position detecting device and the control unit, the shape of the connecting board may be made to conform thereto and connections with the shift position detecting device or the control unit can be made more flexibly and easily. Where the connecting board that conforms to at least the shape of at least one of the shift position detecting device and the control unit, connections with the connecting board can be carried out flexibly and easily. In particular, where the shape of the connecting board conforms to the quadrangular shape of the control board, dead space in the casing due to the quadrangular shape of the control board can be utilized effectively.

The shape of the connecting board may also conform to that of the shift position detecting device or to that of the control unit. For example, the shift position detecting device may have a circular section orthogonal to its axis, in which case the connecting board is formed with an external shape having a curvature that conforms to the circular section to more effectively utilize the space within the casing.

The shift position detecting device is preferably a non-contact type sensor. The non-contact type sensor includes an element on a manual shaft and magnetic field generating means in which a generated magnetic field changes in accordance with the manual operation by the vehicle driver, and the sensor output changes in relation to the changing magnetic field.

Alternatively, the shift position detecting device may include a contact-type sensor provided on a manual shaft and including a movable contact that moves in accordance with the manual operation of the vehicle driver, and a fixed contact. This type of sensor detects a shift position depending on contact or non-contact between the movable contact and the fixed contact. The control apparatus with the contact-type sensor may also have an output circuit portion connected with the connecting board.

The control apparatus may further include an output circuit portion for outputting a signal from the sensor, wherein the output circuit portion is connected to the connecting board.

In a preferred embodiment the output circuit portion and the connecting board partially overlap each other and the output circuit portion and the connecting board are joined by soldering the overlap portion.

As previously noted, the control apparatus with shift position detecting device in one preferred embodiment has an overlap portion where the output circuit portion and the connecting board partially overlap each other and their overlapping portions are joined by soldering. Of course, the control board and the connecting board may also be disposed so as not to overlap.

The shift position detecting device and the control board preferably do not overlap on the same plane and preferably do not overlap in a direction perpendicular with respect to the plane in which the control board is disposed.

The control apparatus according to the present invention preferably has the shift position detecting device and the control board accommodated in a casing, and includes adjusting means for height adjustment between the shift position detecting device and the connecting board, and/or between the connecting board and the control board. This adjustment means may be in the form of a recess and a projection in and on which the shift position detecting device and the control board are respectively disposed. In this manner connections with the connecting board are facilitated.

The casing may have one or more walls separating the shift position detecting device from the control board. For example, the walls may include a first wall which surrounds the shift position detecting device and a second wall which surrounds the control board. Movement of the shift position detecting device and the control board in a horizontal direction with respect to the casing is restricted by the walls. Furthermore, foreign material such as minute particles of dust or the like generated by the shift position detecting device are blocked by the wall, and adverse effect on the control board caused by this foreign material is avoided.

The casing may also include a body portion and a cover portion, and the shift position detecting device is held between the body portion and the cover portion. In this manner, the shift position detecting device can be fixed to the casing even without provision of an additional member for restricting vertical movement of the shift position detecting device with respect to the casing, thereby reducing cost.

A planar seal may be formed between the body and the cover. Because the seal between the body portion and the cover portion lies within a single plane, the sealing performance is improved and the sealing is carried out easily.

In a preferred embodiment the shift position detecting device is bonded to the casing and the first wall so that horizontal movement thereof with respect to the casing is restricted by the first wall, and so that vertical movement thereof with respect to the board is restricted by the casing. That is, a multiplier effect caused by bonding along two directions, which are orthogonal to each other, enables the bonding strength of the shift position detecting device to be intensified.

Preferably, space within the casing other than the space occupied by the control board and the shift position detecting device is substantially occupied by the connecting board.

As noted above, the control apparatus preferably includes a connector portion which is integrated with the shift position detecting device and the control unit, and which is connected to an electrical unit located outside the casing, and has the connector portion connected to the control board through the connecting board. That connector portion may include a first connector portion that connects to an electrical unit within the power train and a second connector portion that connects to a vehicle system other than the power train.

The control board may be formed in a quadrangular shape, and the connecting board formed in a shape that conforms to the quadrangular shape of the control board.

The control apparatus may include a connector portion integral with the shift position detecting device and the control unit and connected to the electrical unit outside the casing, wherein the control board and the shift position detecting device are connected through the connecting board, and the control board and the connector portion are connected through a second connecting board different from the aforementioned connecting board.

The aforementioned connecting board may consist of plural connecting boards including a first connecting board for connecting the shift position detecting device to the control board, a second connecting board for connecting the first connector portion to the control board, and a third connecting board for connecting the second connector portion to the control board. Alternatively, two of the first through third connecting boards may be formed into a common single board. In particular, where the connecting board which connects the control board with the shift position detecting device is different from the connecting board which connects the control board with the connector portion, electrical connection between the control board and the shift position detecting device and electrical connection between the control unit and connector portion can be achieved more flexibly and securely, in accordance with the layout of the shift position detecting device, the control unit and the connector portion. If the function of a second connecting board for connecting the first connector portion to the control board and that of a third connecting board for connecting the second connector portion to the control board, are combined into a common, single connecting board, the quantity of components can be reduced, thereby achieving a reduction in cost.

Optionally, the shift position detecting device has an output portion for outputting a shift position detection signal, and the connecting board is formed in a shape corresponding to the number of terminals of the output portion. Alternatively, the connecting board is formed in a shape corresponding to the quantity of terminals of at least one of the first connector portion and the second connector portion.

The control board may have a rectangular shape, i.e., a long side and a short side, wherein the shift position detecting device and the first connector portion are disposed in the vicinity of the long side while the second connector portion is disposed in the vicinity of the short side.

A connecting portion of the first connector portion and the control unit may together overlap one side of the shift position detecting device.

The shift position detecting device may have a projection and a sectional shape, inclusive of the projection, which is elliptical or substantially elliptical, i.e., having a major axis and a minor axis, with the major axis and the long side of the control board arranged in parallel or substantially parallel.

The control board preferably includes the plurality of devices for controlling the power train responsive to a detection signal representative of a vehicle running state and has a connector portion connected to an external electrical unit, with the shift position detecting device and the connector portion arranged in parallel in the vicinity of one side of the control board. In one embodiment, the control board is a quadrangular ceramic board.

In another preferred embodiment the control board is formed in a quadrangular shape and has a first connector that connects to an electrical unit inside a power train, and a second connector portion that connects to a vehicle system outside the power train, and the shift position detecting device is disposed in parallel with any one of the first connector portion and the second connector portion on one side of the quadrangular shape, while the other of the first connector portion and the second connector portion is disposed on the other side of the quadrangular shape. The control board is connected to the shift position detecting device through the connecting board.

The connector portion that connects to an electrical unit outside the casing preferably has stress absorbing and alleviating means.

Because at least one of the shift position detecting device and the connector portion is connected to the control board through the connecting board, at least one of the shift position detecting device, the control unit and the connector portion can be laid out freely within the casing. With the shift position detecting device connected to the control board through the connecting board, connection between the shift position detecting device and the control board of the control unit can be laid out freely, thereby increasing versatility.

Because the control board is constituted by a board comprising material having a high heat dissipation capacity, heat from devices mounted on the control board can be effectively dissipated. Moreover, because the control board is a board of a material having a high heat resistance, it has high durability notwithstanding heat from the devices mounted on the control board.

Because the connecting board is fabricated of a less expensive material, costs can be suppressed while the control board in which the devices are disposed can be fabricated of material securing control reliability. Moreover, in a preferred embodiment wherein the control board is a ceramic board, heat dissipation and heat resistance are improved, thereby minimizing cost.

Further, where the connecting board is flexible, its flexibility allows for manufacturing errors and installation errors of the electrically connected components. Even if, for example, the control apparatus with shift position detecting device is placed in an extremely severe thermal environment, such as an engine compartment, and the shift position detecting device and/or the connector portion expands or contracts due to heat, that expansion or contraction is without adverse affect due to the flexibility of the board material. Where the connecting board is a glass cloth epoxy board the connecting means can be cheaply formed, thereby minimizing cost of the control apparatus.

One advantage of use of a non-contact type shift position detecting device, is that it is becomes unnecessary to provide a contact for each shift position, unlike a contact-type shift position detecting device, thereby enabling the apparatus to be made more compact.

The non-contact type shift position detecting device includes a sensor whose output changes in relation to the changing magnetic field, and therefore the magnetic field of the magnetic field generating means changes in accordance with the manual operation by the vehicle driver so that the output of the sensor changes continuously, thereby enabling the shift position to be detected continuously.

Moreover, since the output circuit portion for outputting a signal from the sensor is connected to the connecting board, the sensor and the connecting board can be connected together easily.

Moreover, since the output circuit portion and the connecting board are joined by soldering an overlapped portion, where the output circuit portion and the connecting board are located on the same plane, the sensor and connecting board can be connected to each other easily and securely, and at a lower cost than in the case of wire bonding or the like which requires strict control.

Moreover, since, in the control apparatus according to the present invention, the shift position detecting device is a contact-type shift position detecting device of the type generally used in a conventional power train, the control apparatus can be fabricated at a low cost.

Moreover, because the output circuit portion of the shift position detecting device is connected with the connecting board, the shift position detecting device and the connecting board can easily be connected to each other.

Moreover, because the control board and the connecting board are disposed on coplanar surfaces, the connecting portion between the control board and the connecting board can be made thinner, thereby enabling the control apparatus to be formed more compact by that amount.

Moreover, because the shift position detecting device and the control board are disposed so as not to overlap, the control apparatus with can be made thinner overall and, consequently, the control apparatus can be mounted in various positions and interference with other devices can be prevented.

Moreover, because the shift position detecting device and the control board are disposed so as not to overlap perpendicularly with respect to the plane in which the control board is disposed, the control apparatus can be made thinner overall and, consequently, the control apparatus can be mounted in various positions and interference with other devices can be prevented.

BRIEF DESCRIPTION OF THE DRAWINGS

FIG. 3(a) is a sectional view taken along the line IIIA—IIIA in FIG. 2 and

FIG. 3(b) is a sectional view taken along the line IIIB—IIIB in FIG. 2;

FIG. 9(c) is a schematic diagram, similar to FIG. 10(b), showing the same structure after soldering;

DESCRIPTION OF THE PREFERRED EMBODIMENTS

Hereinafter, preferred embodiments of the present invention will be described with reference to the accompanying drawings.

A first embodiment of the invention will be described with reference to FIGS. 1–4.

Figure 1:
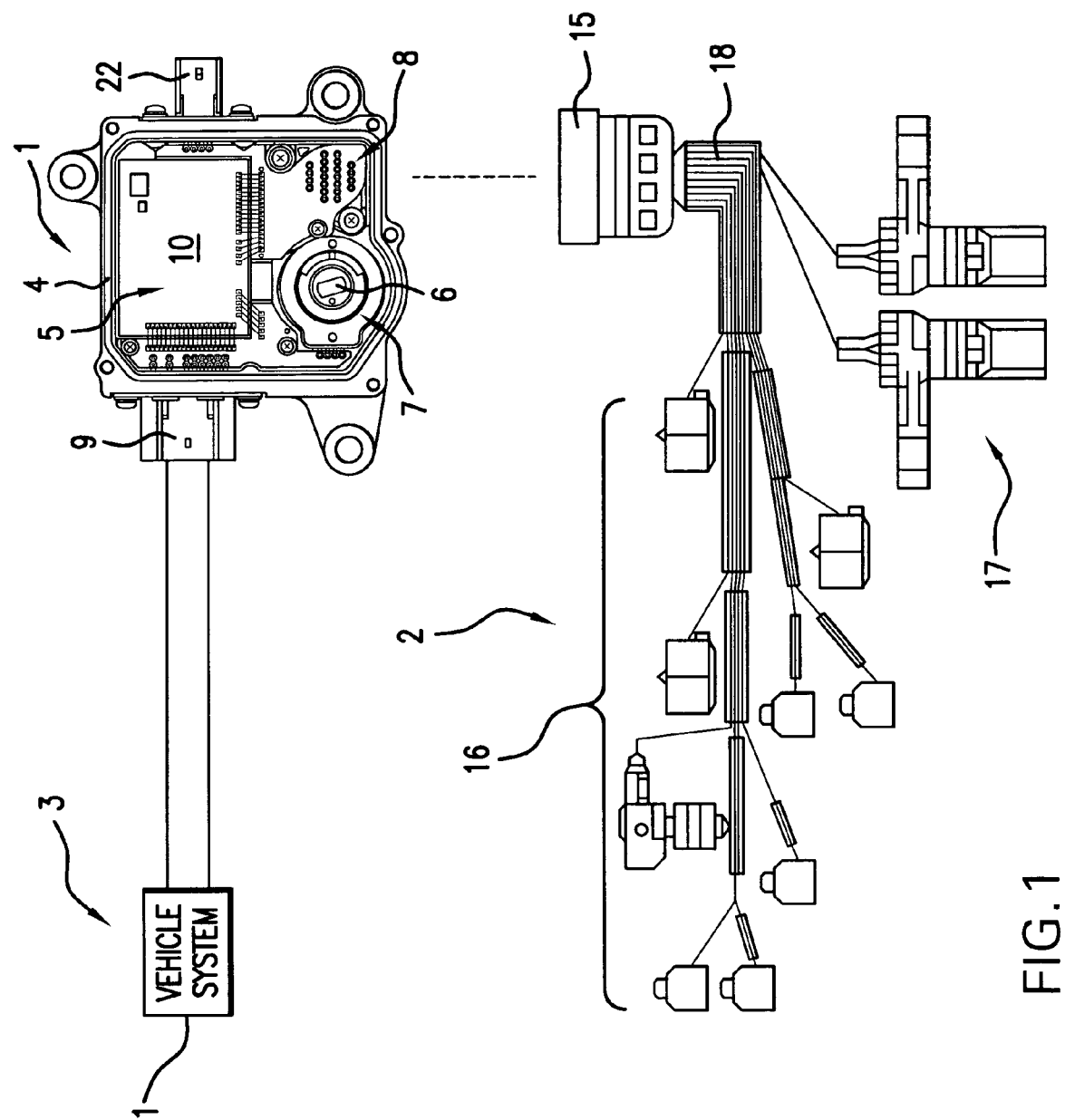
FIG. 1 is a schematic diagram of electrical connection structure in an A/T, which is one example of a power train adaptable to a first embodiment of a control apparatus according to the present invention.

As shown in FIG. 1, in the structure of the A/T electric connection of the first embodiment, an A/T 2 controlled by a control apparatus with a shift position detecting device 1 and a vehicle system 3, which supplies the control apparatus 1 with vehicle running information and which receives an A/T shift position signal, a starter drive signal and a reverse lighting signal from the A/T 2, and the control apparatus 1, are electrically connected to the control apparatus 1.

Figure 2:
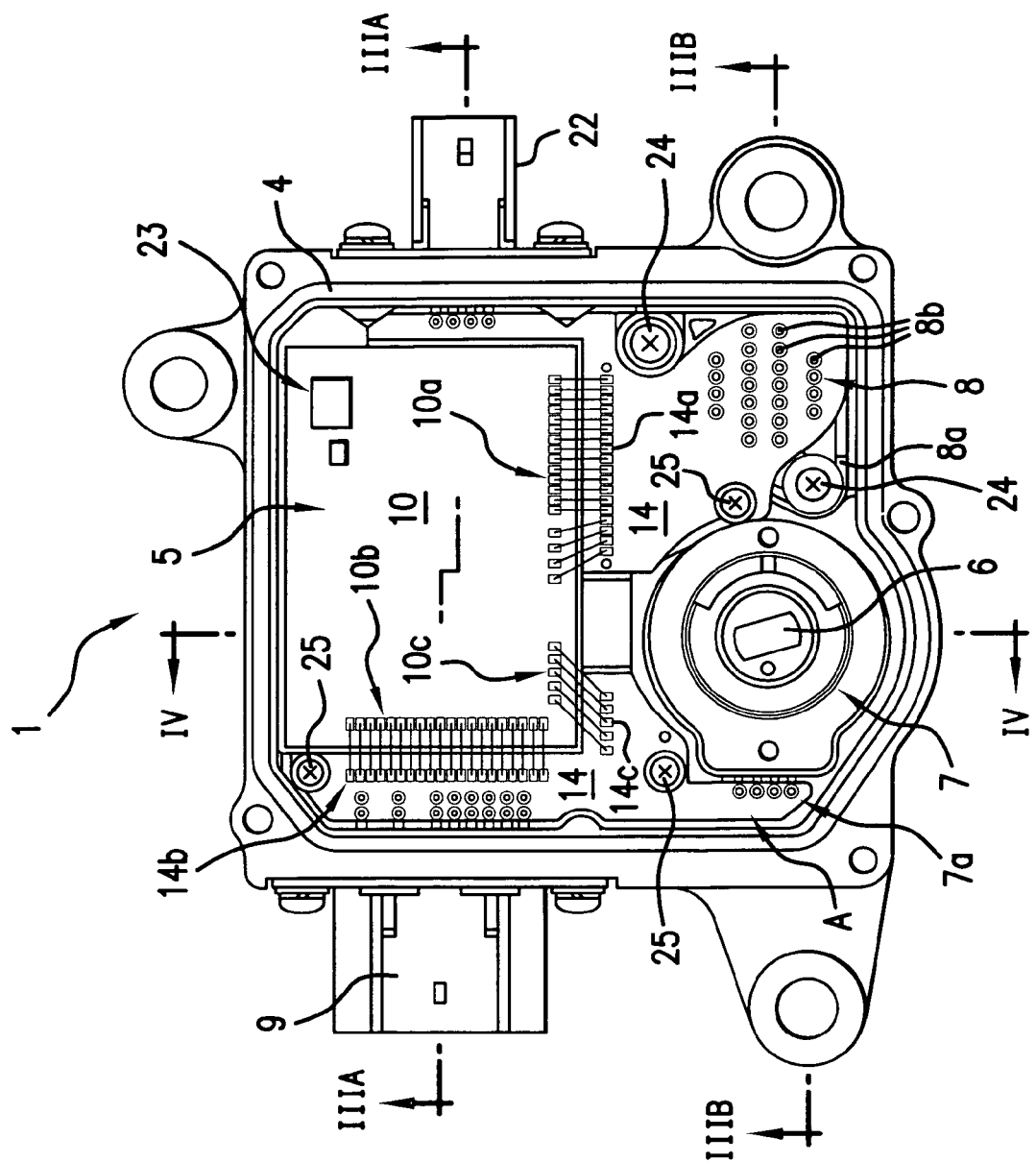
FIG. 2 is a plan view of the control apparatus shown in FIG. 1.

As shown in FIGS. 2, 3(a), and 3(b) in detail, the control apparatus 1 includes a casing 4 which houses an ECU 5 for controlling speed change in the A/T and a shift position detecting device 7, which is manually operated by a shift lever, shift switch, shift dial, or the like by the vehicle driver, for detecting rotational position of a manual shaft 6 (corresponding to a shift unit of the present invention) of the A/T which is changed in accordance with the manual operation. Further, a connector 8 for connecting with the A/T (corresponding to a first connector portion of the present invention) extends parallel to the manual shaft 6 and is connected to a solenoid, a sensor or the like in the A/T. A connector 9 is connected with the vehicle system for receiving vehicle running condition detection signals such as for engine speed, engine cooling water temperature and the like from an engine ECU which controls the engine. The connectors 8 and 9 and a speed sensor connector 22 are also contained in the casing 4. The "external electric device" referred to herein is at least one of a solenoid and a sensor in the A/T, and the engine ECU, all of which are external to (remote from) the A/T.

The ECU 5 has a rectangular control board 10, for example a ceramic board or the like having a higher heat resistance and heat dissipation capacity than a connecting board 14, which will be described later, in order to provide environment resistance reliability. A plurality of circuit chips (devices) 23, mainly microcomputers, are disposed on this control board 10 and each circuit chip includes, for example, terminal groups 10a, 10b, and 10c disposed along two sides of the control board 10. The control board 10 is fixed on the casing 4 over its entire face with an adhesive agent. If the control board 10 were to be fixed on the casing 4 with bolts, there would be the possibility that the ceramic board might be damaged by vibration or the like. But by bonding with an adhesive over the entire face, such damage can be effectively prevented and heat generated in the devices 23 can be released to the casing 4 from the control board 10 through the adhesive agent, thereby increasing the heat dissipation effect.

The control board 10 is a board of an insulating material having wiring electrically connected to devices provided on the board 10.

As shown in FIG. 3(b), the shift position detecting device 7 includes a movable element 11 which is fixed on the manual shaft 6 and which rotates integrally with the manual shaft 6, a permanent magnet 12 (corresponding to the "magnetic field generating means" of the present invention) which is fixed on the movable element 11 and is integrally rotatable therewith, and a magnetic sensor 13, such as a Hall element (Hall IC) or the like, which detects changes in magnetic field due to rotation of the permanent magnet 12, without contacting the permanent magnet 12, and generates, for example, an electromotive force.

Therefore, if the manual shaft 6 is rotated by a manual shift operation of the vehicle driver, the position of the permanent magnet 12 relative to the magnetic sensor 13 changes. That is, since the magnetic field of the permanent magnet 12 changes, the magnetic sensor 13 outputs a voltage value corresponding to the change in the magnetic field. Since the voltage value corresponds to a change in the speed range position by the manual operation, the change in speed range position can be detected as a voltage value.

As shown in FIG. 2, the shift position detecting device 7 is provided with an output circuit portion 7a that outputs a voltage signal from the magnetic sensor 13. The output circuit portion 7a is constructed of a board having a conductor, and this conductor is connected electrically to a conductor of the connecting board 14 so as to output the voltage signal from the output circuit portion 7a to the connecting board 14. In this case, the output circuit portion 7a and the connecting board 14 are disposed on the same plane and their edges do not overlap in a direction perpendicular to the plane on which the output circuit portion 7a and the connecting board 14 are disposed (perpendicular to the drawing in FIG. 2) so as to minimize the thickness of the control apparatus 1. The connecting board 14 is fixed to the casing 4 with a bolt to provide electrical grounding through the bolt. Here, less consideration need be given to heat dissipation because no device is disposed on the connecting board, unlike the control board 10.

Figure 4A:
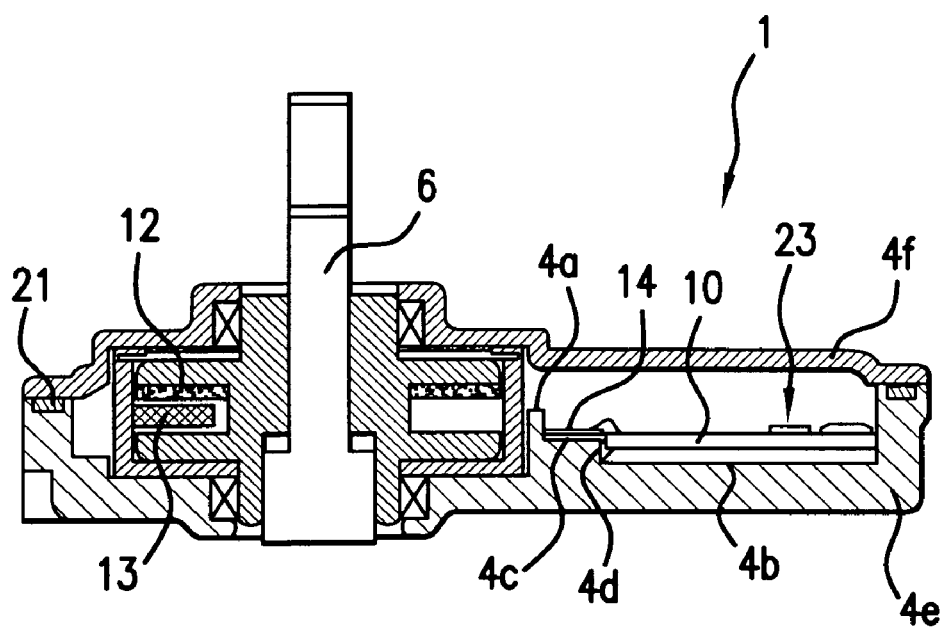
FIG. 4(a) is a sectional view of the control apparatus taken along the line IV—IV in FIG. 2.

As shown in FIG. 4(*a*), the shift position detecting device 7 is disposed on the casing 4 and is bonded to a first wall 4*a* which surrounds the shift position detecting device 7 so that horizontal movement of the shift position detecting device 7 with respect to the casing 4 is restricted by the first wall 4*a*.

The casing 4 includes a body portion 4*e* and a cover portion 4*f* which closes a top end opening portion of the body portion 4*e*. The shift position detecting device 7 is held between the body portion 4*e* and the cover portion 4*f* so that movement perpendicular to the casing 4 (the vertical direction in FIG. 4(*a*)) is restricted. Further, a space between the body portion 4*e* and the cover portion 4*f* is sealed by a planar sealing member 21.

The connecting board 14 substantially covers that portion of the body 4*e* of casing 4 not occupied by the control board 10 of the ECU 5 and the shift position detecting device 7 carries a wiring circuit (not shown), and is disposed within the casing 4. Further, the control board 10 and the connecting board 14 are coplanar so that edges opposing each other do not overlap, thereby reducing the thickness of the control apparatus 1.

The connecting board 14 is composed of a flexible material which is easier to process than a ceramic board, and is formed to conform to the rectangular shape of the control board 10 (this may also be square) and to have an inner edge conforming with the circular cross-section of the shift position detecting device 7. Further, the shape of the connecting board 14 must be in accordance with a terminal group (not shown) of the output circuit portion 7*a* of the shift position detecting device 7 and the connector 8 for connecting with the A/T, provided in the vicinity of the long side of the control board 10 as described later, and with the number of terminals of circuit terminal groups 14*a* and 14*b* of the connector 9 connecting with the vehicle system, provided in the vicinity of the short side of the control board 10. That is, its shape is determined in accordance with the number of terminals of the connectors 8 and 9.

Additionally, the connecting board 14 is composed of material easier to process and cheaper than the control board 10, for example, a glass cloth epoxy board (hereinafter sometimes referred to as a "glass epoxy board"), a flexible board or the like. "Easy to process material" refers to a material which may be cut into a complicated shape, such as a curved shape or a bent line shape as opposed to a straight cut from a single board and which is relatively soft. This definition of the "easy to process material" may also be applicable to the control board 10, which is also composed of easy to process material and will be described later. The shift position detecting device 7 and the control board 14 are separated from each other by the first wall 4*a*.

On the connecting board 14, three circuit terminal groups 14*a*, 14*b*, and 14*c* are disposed along and in the vicinity of the two sides, the long side and the short side, of the control board 10, in correspondence with three circuit terminal groups 10*a*, 10*b*, 10*c* of the control board 10. The respective circuit terminals of the circuit terminal groups 14*a*, 14*b*, and 14*c* may be electrically connected to the magnetic sensor 13 of the shift position detection device 7, to any one of a number of input/output terminals 8*b* of the connector 8 for connecting with the A/T and to the connector 9 for connecting with the vehicle system through the wiring of the connection board 14.

The connecting board 14 is composed of a relatively soft easy to process material as described above, so that it may be formed into any shape. Consequently, it can conform flexibly and easily with the layouts of the ECU 5, the shift position detecting device 7, the connector 8 and the connector 9, so that no dead space remains within the casing 4, and the interior of the casing 4 can thereby be used more efficiently.

As shown in FIGS. 4(*a*) and 4(*b*), a recess 4*b* and a projection 4*c* are formed in the casing 4 for respectively mounting the control board 10 and the connecting board 14. Thus, by changing the depth of the recess 4*b* and height of the projection 4*c* in accordance with the thickness of each of the control board 10 and the connecting board 14, the top face of the control board 10 and the top face of the connecting board 14 can be set in substantially the same plane, as shown in the diagram. Further, although not shown, the height of the projection 4*c* to which the connecting board 14 is fixed may be set so as to enable the magnetic sensor 13 and the wiring of the connecting board 14 to be on substantially the same plane. The recess 4*b* and the projection 4*c* therefore form "plane adjusting means" for adjusting the surfaces of the boards so as to lie substantially in the same plane in the casing 4.

By adjusting the top face of the control board 10 and the top face of the connecting board 14 to lie in substantially the same plane in this way, electrical connection between a circuit terminal of the control board 10 and a circuit terminal of the connecting board 14, and electrical connection between the magnetic sensor 13 and the wiring of the connecting board 14 can be achieved securely and easily.

An L-shaped step is formed between the recess 4*b* and the projection 4*c* as a second wall 4*d* which surrounds part of the control board 10. Thus, the first wall 4*a* and the second wall 4*d* form the wall of the present invention that is located between the shift position detecting device 7 and the control board 10.

Figure 5A:
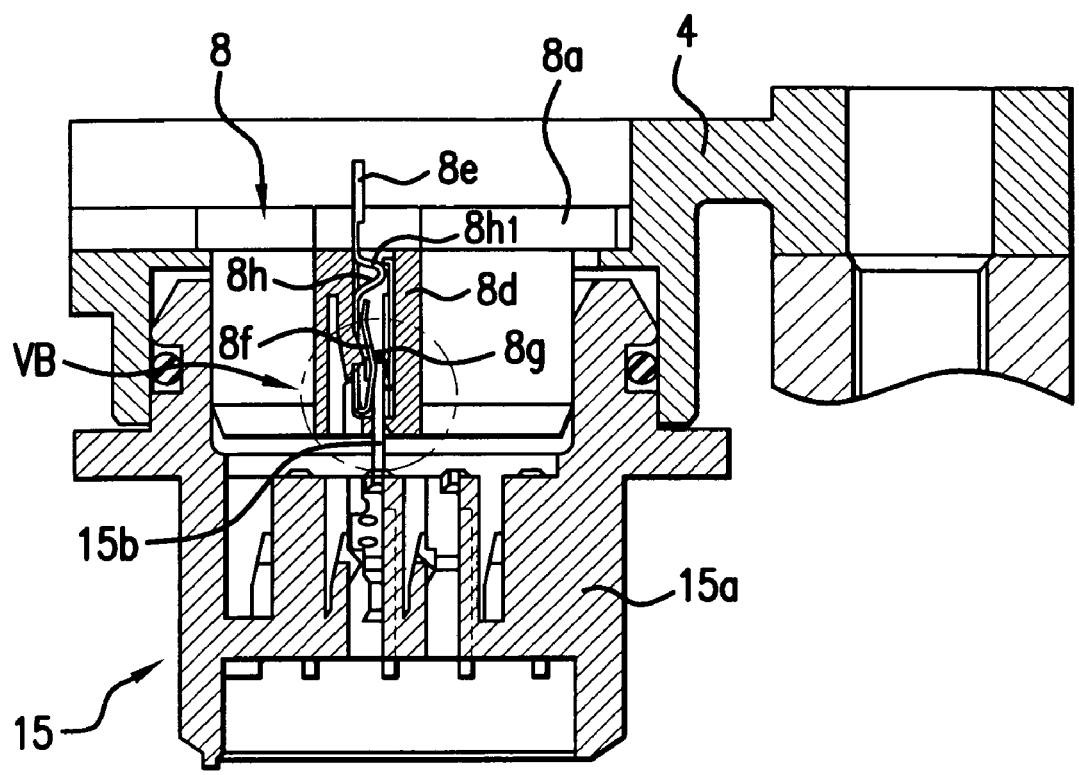
FIG. 5(a) is a sectional view of a connector portion of the apparatus of FIG. 1
Figure 5B:
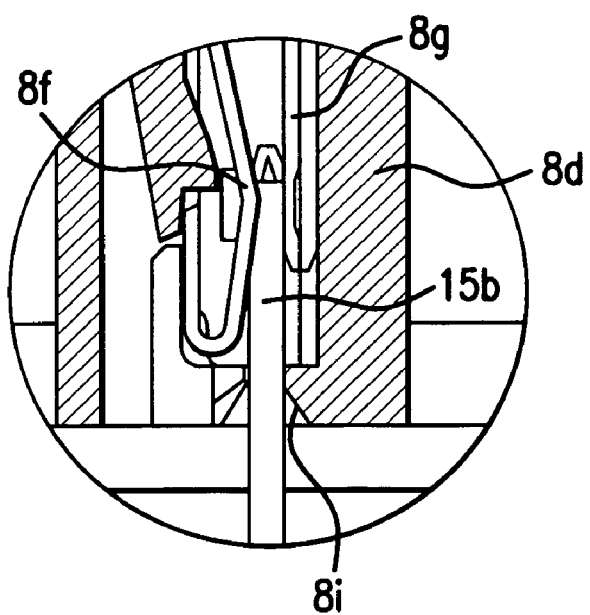
FIG. 5(b) is a partially enlarged sectional view of a portion VB in FIG. 5(a)
Figure 6:
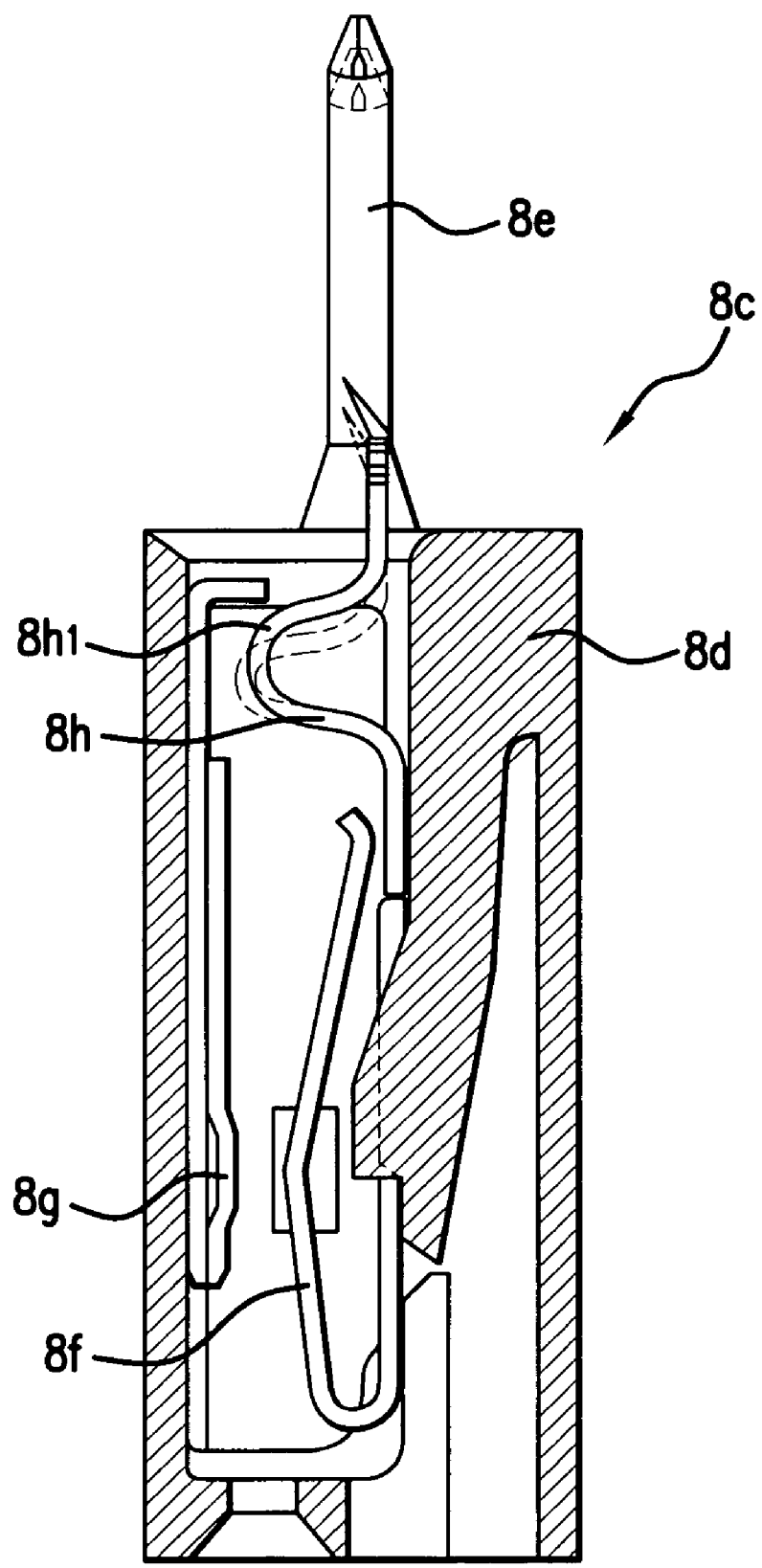
FIG. 6 is an enlarged sectional view of the female connector shown in FIG. 5(a) and FIG. 5(b)

As shown in FIGS. 3(*b*) and 5(*a*), the connector 8 for connecting with the A/T includes a connector cover 8*a* provided on the casing 4 and a female connector portion 8*b* that connects to the connecting board 14 through the connector cover 8*a*. The connector portion 8*b* has 22 female connectors in the example shown in FIG. 2 and these female connectors all have the same structure. Note that FIG. 5(*a*) shows only one female connector. FIG. 6 shows a female connector 8*c* as including a connector main body 8*d* fixed on the connector cover 8*a*, a connecting terminal 8*e* fixed on one end of the connector main body 8*d*, a first contact portion 8*f* in the form of a bent conductive plate fixed on the connector main body 8*d*, a second contact portion 8*g* in the form of a conductive plate fixed on the connector main body 8*d* with a predetermined clearance relative to the first contact portion 8*f*, and a conductor 8*h* which connects the connecting terminal 8*e* with the first contact portion 8*f*. The conductor 8*h* is provided with a stress absorption and alleviation portion $8h_1$ which is curved in a U shape. When a stress such as thermal stress caused by heat of the A/T is received by the connecting terminal 8*e*, the stress absorption and alleviating portion $8h_1$ distorts as indicated by the single dashed line so that the connecting terminal 8*e* is displaced as indicated by the single dashed line to prevent concentration of excess stress.

The structure of the connector 8 for connecting with the A/T which includes the stress absorption and alleviating portion $8h_1$ can also be utilized for the other connector 9 which connects with the vehicle system, and for the speed sensor connector 22.

The plastic connector cover 8*a* is fixed to the casing 4 from both sides with a bolt 24 in order to improve the seal. The connecting board 14 covers the plastic connector cover 8a, and is fixed to the casing 4 with a bolt 25. In this manner, the connecting board 14 is provided in a raised position with a predetermined spacing from the casing 4.

The speed sensor connector 22 is for connection with a speed sensor (not shown) provided on the exterior of the A/T case. Because it cannot be provided together with the connector 8 that connects with electrical units within the A/T case, the connector 8 for connecting with the A/T is provided separately from the speed sensor connector 22.

As shown in FIG. 1, the connector 8 is connected electrically and directly to an A/T side connector 15, which is a male connector fixed to the A/T case (not shown). As shown in FIG. 5(a), a connector cover 15a of the A/T side connector 15 seals with the connector cover 8a when they are fitted together. In this case, as shown by the enlargement in FIG. 5(b), a connecting terminal 15b of the A/T side connector 15 passes through an insertion hole 8i in the connector main body 8d corresponding to the connecting terminal 8e of the female connector 8c, so that it enters by forcing the first contact point 8f and the second contact point 8g apart. Thus, the connecting terminal 15b of the A/T side connector 15 is pressed by the first and second contact portions 8f and 8g, so that the connecting terminal 15b of the A/T side connector 15 is electrically connected to the connecting terminal 8e of the connector 8.

A wire harness 18, which is an assembly of the wirings of various kinds of sensors 16 in the A/T case and the wirings of solenoids 17 in the valve body in the A/T case, is connected to the A/T side connector 15.

As shown in FIG. 3(a), the connector 9 for connecting with the vehicle system includes a connector cover 9a provided on the casing 4, and a connector portion 9b that connects to the connecting board 14 through the connector cover 9a. As shown in FIG. 1, the connector portion 9b is connected to the vehicle system 3 for receiving a vehicle running condition detection signal, such as for engine speed, engine cooling water temperature and the like, from the engine ECU.

Because the shift position detecting device 7, the A/T connecting connector 8 and the connector 9 for connecting with the vehicle system are connected to the ECU 5 through the connecting board 14, the shift position detecting device 7, the connectors 8 and 9 and the ECU 5 can be freely laid out in the casing 4.

Therefore, since the layout can be freely made, the wiring pattern and the circuit pattern of the ECU 1 do not need to be redesigned for each type of A/T, thereby reducing cost and increasing versatility.

Further, since the control board 10 has a high heat dissipation capacity, heat from the devices mounted on the control board can be effectively dissipated.

Moreover, since the control board 10 has high heat resistance it also has durability notwithstanding being subject to heat from the devices and heat within the engine room.

Moreover, by forming the connecting board 14 of a cheaper material than that of the control board 10, cost can be controlled and, at the same time, a more accurate control can be assured for the control board 10 in which the devices are disposed.

Moreover, by using a ceramic board only for the control board which carries the devices, the requisite heat dissipation capacity and heat resistance are provided while minimizing cost. Likewise, use of a glass epoxy board as the connecting board 14 serves to minimize cost of the control apparatus 1.

Moreover, employment of a flexible connecting board 14 provides allowance for component manufacturing errors and installation errors. For example, if the control apparatus 1 is subjected to an extremely severe temperature environment such as that in an engine compartment, whereby the shift position detecting device and/or the connector portion of the connecting board expands or contracts due to heat, that expansion or contraction can be effectively absorbed by the flexibility of the board material.

Since the shift position detecting device 7 is a non-contact type sensor, it is not necessary to provide a contact for each shift position, unlike application of a contact-type shift position detecting device, thereby enabling the apparatus to be made more compact. Further, the non-contact type shift position detecting device 7 does not generate metallic powder or the like by contact friction, as do contact-type sensors with grease applied to the contacts, adverse effect on the control board 10 is prevented. Moreover, since the output of the magnetic sensor 13 changes continuously as the magnetic field of the permanent magnet 12 changes in accordance with a manual operation by the vehicle driver, the shift position can be detected continuously. Moreover, since the output circuit portion 7a which outputs a signal from the magnetic sensor 13 is connected to the connecting board 14, the magnetic sensor 13 and the connecting board can easily be connected together.

Because the control board 10 and the connecting board 14 do not overlap each other, i.e., are coplanar, the connection between the control board 10 and the connecting board 14 can be made thinner, thereby enabling the control apparatus 1 to be formed more compactly by that amount.

Moreover, since the shift position detecting device 7 and the control board 10 do not overlap each other, the control apparatus 1 can be made thinner overall and consequently, the control apparatus 1 can be more easily mounted in various positions without interference with other devices. Further, because the control board 10 does not overlap the shift position detecting device 7, the control board 10 can be more easily replaced.

Because the shift position detecting device 7 and the control board 10 do not overlap each other in a direction perpendicular to the plane in which the control board 10 is disposed, the control apparatus with shift position detecting device 1 can be made thinner overall and, consequently, the control apparatus 1 may be more easily mounted in various positions without interference with other devices.

Moreover, even if the height of the shift position detecting device 7, the height of the control board 10 and the height of the connecting board 14 are different, allowance therefor can be made by changing the depth of recess 4b and length of projection 4c, which constitute the "plane adjusting means". In this manner, the shift position detecting device 7, the control board 10 and the connecting board 14 can be arranged on the same plane, thereby facilitating connection with the connecting board 14.

Moreover, the walls 4a and 4d of the casing 4 separate the shift position detecting device 7 and the control board 10, thereby improving operability. Additionally, horizontal movement of the shift position detecting device 7 and the control board 10 with respect to the casing 4 is restricted by the walls 4a and 4d. Furthermore, since foreign material such as minute particles of dirt and the like generated by the shift position detecting device 7 are blocked by the walls 4a, 4d to prevent adverse affect on the control board 10.

Moreover, since the shift position detecting device 7 is fixed between the body portion 4e and the cover portion 4f of the casing 4, no additional member for restricting vertical movement of the shift position detecting device 7 is required, thereby further reducing cost.

Moreover, since sealing between the body portion 4e and the cover portion 4f extends through a single plane, the sealing can be executed effectively, thereby facilitating and improving the sealing.

Figure 4B:
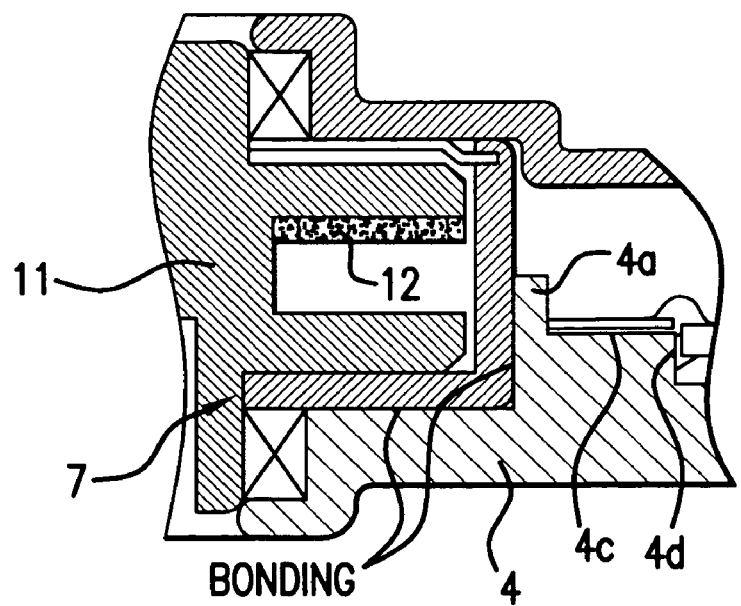
FIG. 4(b) is a partially enlarged sectional view of FIG. 4(a)

Moreover, as shown by enlargement in FIG. 4(b), the shift position detecting device 7 can be bonded so that horizontal movement thereof relative to the casing 4 is restricted by the first wall 4a, and so that vertical movement thereof relative to the board is restricted by the casing 4. That is, a multiplier effect is provided by bonding in two directions orthogonal to each other, thereby intensifying the bonding strength of the shift position detecting device 7.

Figure 7B:
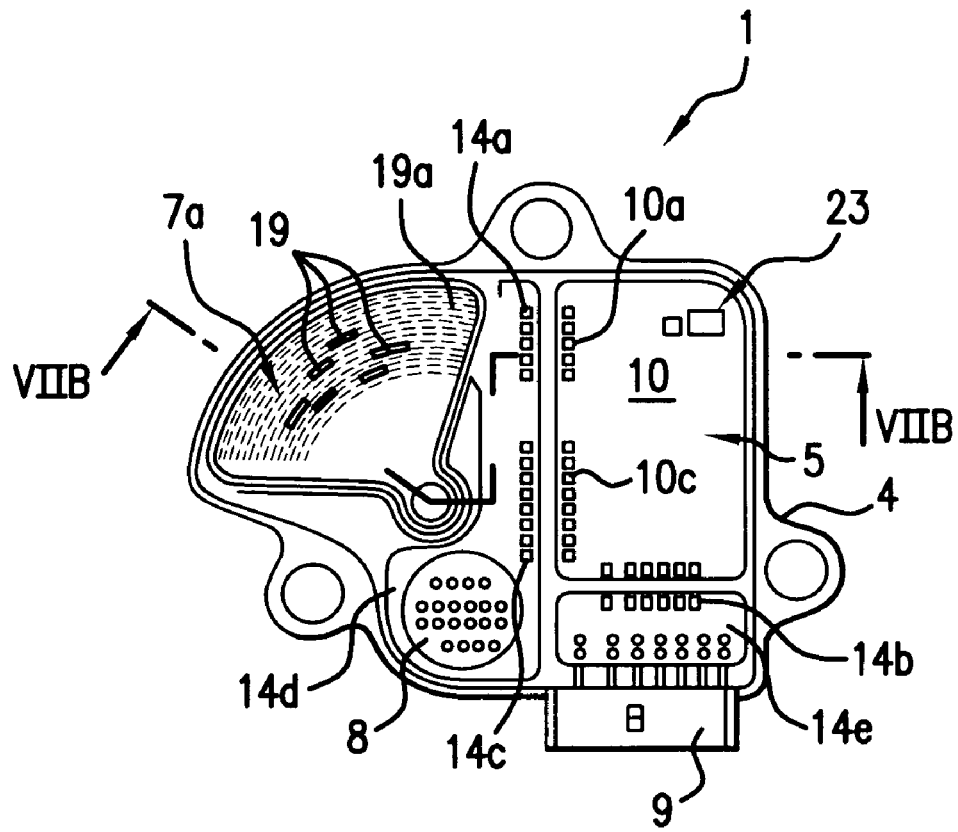
FIG. 7(b) is a sectional view taken along the line VIIB—VIIB in FIG. 7(a)

FIG. 7 shows a second embodiment of the control apparatus according to the present invention. In the description which follows, structural components the same as those described above in connection with the first embodiment are designated by identical reference numerals and detailed description thereof is omitted.

Figure 7A:
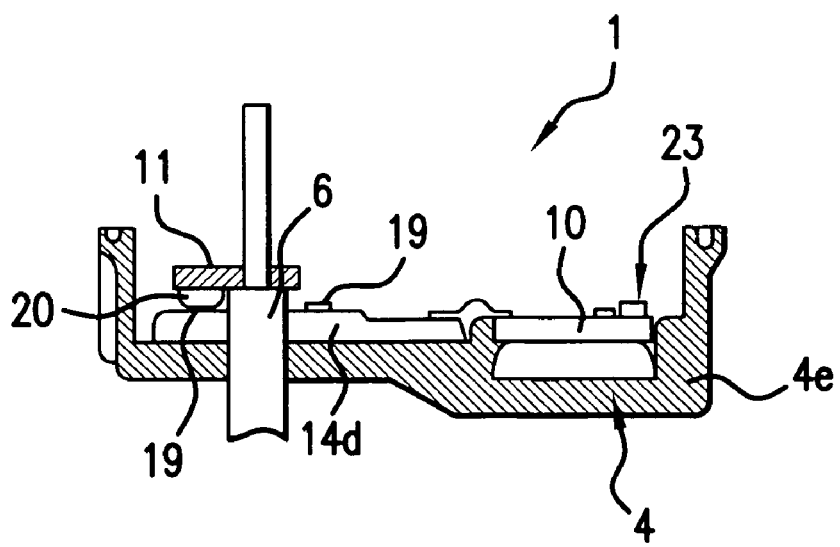
FIG. 7(a) is a plan view of a second embodiment of the control apparatus according to the present invention.

While the first embodiment was described as having a non-contact type shift position detecting device 7a, the control apparatus 1 of the second embodiment as shown in FIGS. 7(a) and (b), includes a conventional contact type shift position detecting device 7a, for example, the shift position detecting device described in the aforementioned patent publication. This contact-type shift position detecting device 7a has a predetermined number of fixed contacts 19 and a movable contact 20 which makes contact selectively with some number of the fixed contacts 19, in accordance with the shift position, or makes no contact.

Furthermore, according to the second embodiment, the connecting board 14 is divided into two different connecting boards 14d and 14e. One connecting board 14d is provided with the connector 8 for connecting with the A/T, the circuit terminal groups 14a and 14c of the ECU 5, and the fixed contact 19 of the shift position detecting device 7a. The other connecting board 14e "second connecting board" is provided with the connector 9 and the circuit terminal 14b of the ECU 5.

Moreover, the connecting board 14d is provided with an output circuit portion 19a constituted by a conductor which makes contact with the fixed contact 19 and the circuit terminal group 14a for output from the contact-type shift position detecting device 7a.

Further, the connecting board 14 is provided with a connecting portion (connecting portion between the circuit terminal group 10c and the circuit terminal group 14c) which connects the connector 8 with the control board 10 of the ECU 5 so as to overlap the side of the shift position detecting device 7a (the right side of the shift position detecting device 7 in FIG. 7(a)).

Because the control apparatus 1 of the second embodiment utilizes a contact-type shift position detecting device, i.e., the type generally used in the conventional A/T, the control apparatus 1 can consequently be manufactured at a lower cost.

Moreover, since the connecting board 14d which connects the control board 10 with the shift position detecting device 7a, and the connecting board 14e which connects the control board 10 with the connector 9 are separate, electrical connection between the control board 10 and the shift position detecting device 7a, and electrical connection between the control board 10 and the connector 9 can be achieved more flexibly and securely in accordance with the layout of the shift position detecting device 7a, the ECU 5 and the connector 9 for connecting with the vehicle system.

Moreover, since the connecting portion between the connector 8 for connecting with the A/T and the ECU 5 overlaps the side of the shift position detecting device 7a, the dimension of the connecting portion and the shift position detecting device 7a (the vertical dimension in FIG. 7(a)), can be shortened thereby enabling the control apparatus 1 to be formed in a more compact configuration.

Other structures and operational effects of the second embodiment are substantially identical to those of the first embodiment.

Figure 8A:
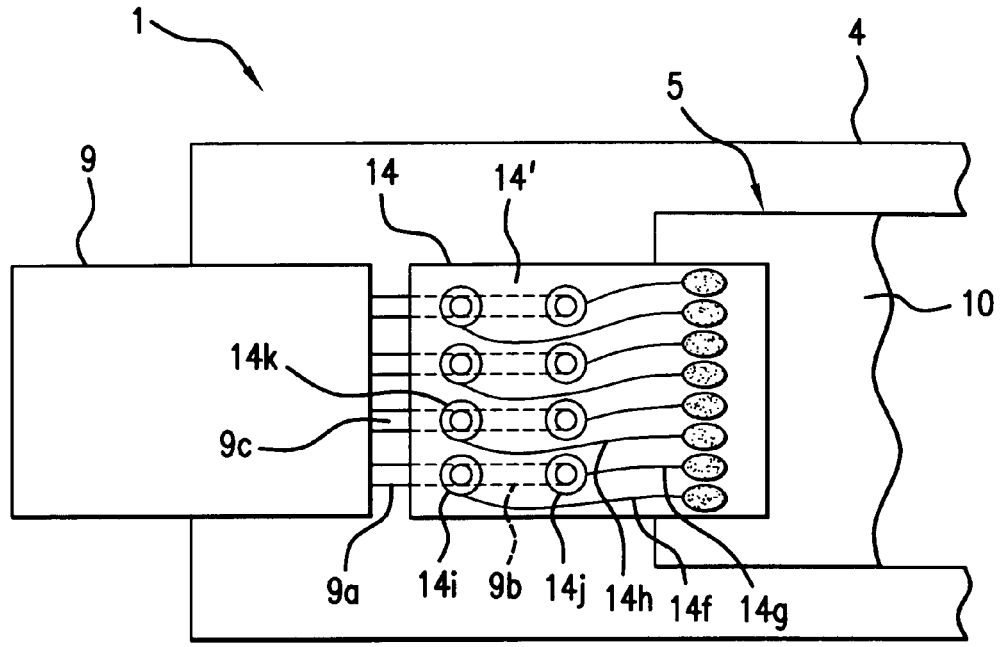
FIG. 8(a) is a schematic top view of a portion of a third embodiment of the present invention.
Figure 8B:
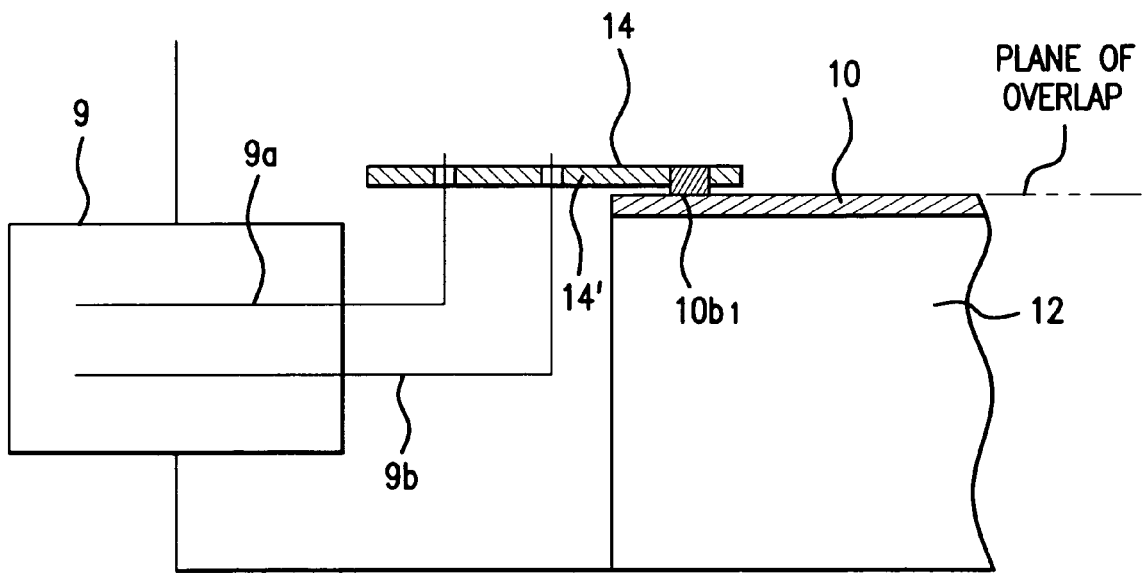
FIG. 8(b) is a front schematic view of the portion shown in FIG. 8(a)
Figure 9A:
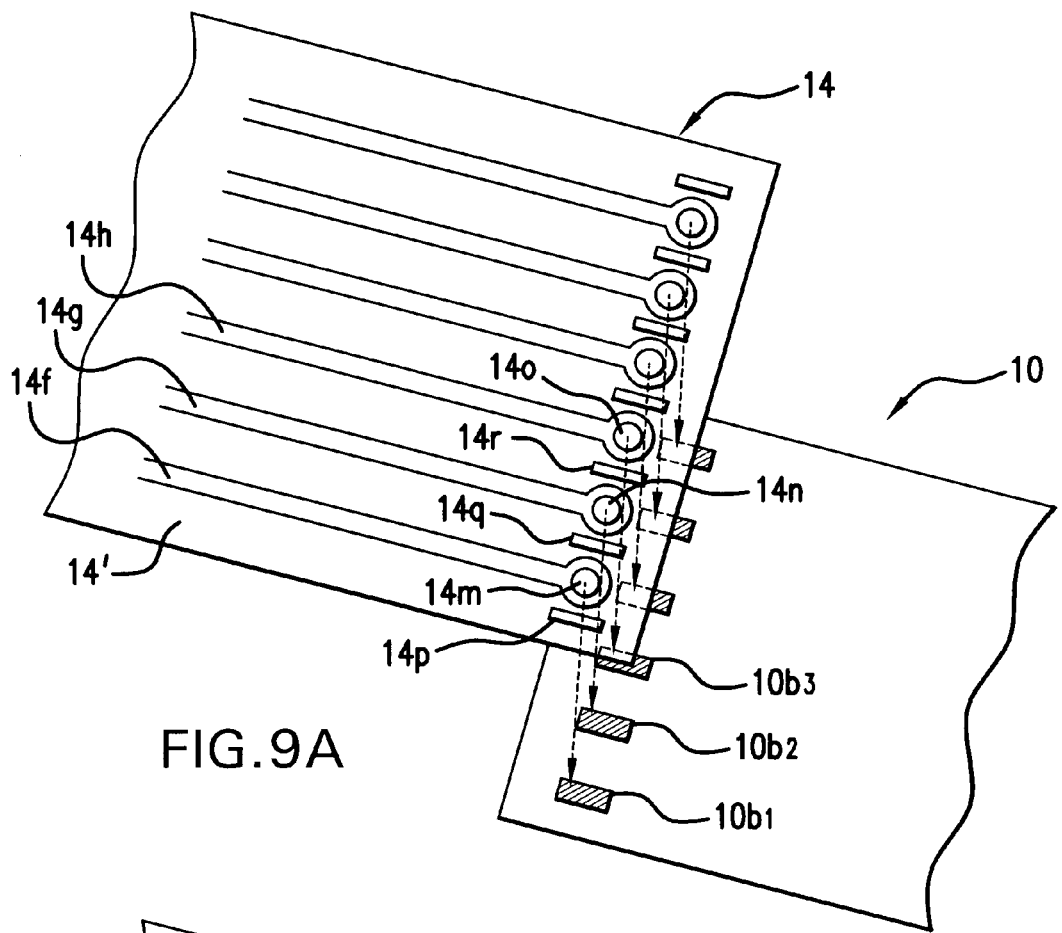
FIG. 9(a) shows a joint portion between a pad of a control board and through holes of a connecting board of the third example, before the control board and the connecting board are bonded together.

FIGS. 8–10 show a third embodiment of an embodiment of the present invention as control apparatus wherein the connecting board 14 is a flexible printed circuit board (FPC). This connecting board 14 includes a circuit pattern composed of a quantity of conductors 14f, 14g, 14h, . . . that are printed on the flexible printed circuit board 14' and mutually insulated, a corresponding number of conductive connector side through holes 14i, 14j, 14k, . . . that are respectively electrically connected to ends of the conductors 14f, 14g, 14h, . . . . Further, a corresponding number of conductive control board side through holes 14m, 14n, 14o, . . . that are respectively electrically connected to the other ends of the conductors 14f, 14g, 14h, and a corresponding number of confirmation holes 14p, 14q, 14r, . . . are punched out in the vicinity of the respective control board side through holes 14m, 14n, 14o, . . . (the control board side through holes 14m, 14n, 14o, . . . and the confirmation holes 14p, 14q, 14r, . . . are shown enlarged in FIG. 9(a)).

Terminals 9a, 9b, 9c, . . . of the connector 9 for connecting with the vehicle system are joined to the corresponding connector side through holes 14i, 14j, 14k, . . . by soldering.

Although in the first and second embodiments, the connecting board 14 and the control board 10 do not overlap as shown in FIGS. 8(a) and 8(b), the connecting board 14 of the third embodiment partially overlaps the control board 10. Further, in this overlapping, the respective control board side through holes 14m, 14n, 14o, . . . are positioned to coincide with terminals $10b_1$, $10b_2$, $10b_3$, . . . in the corresponding terminal group 10b on the control board 10, and are bonded in the overlap as shown in FIG. 9(b).

Figure 10A:
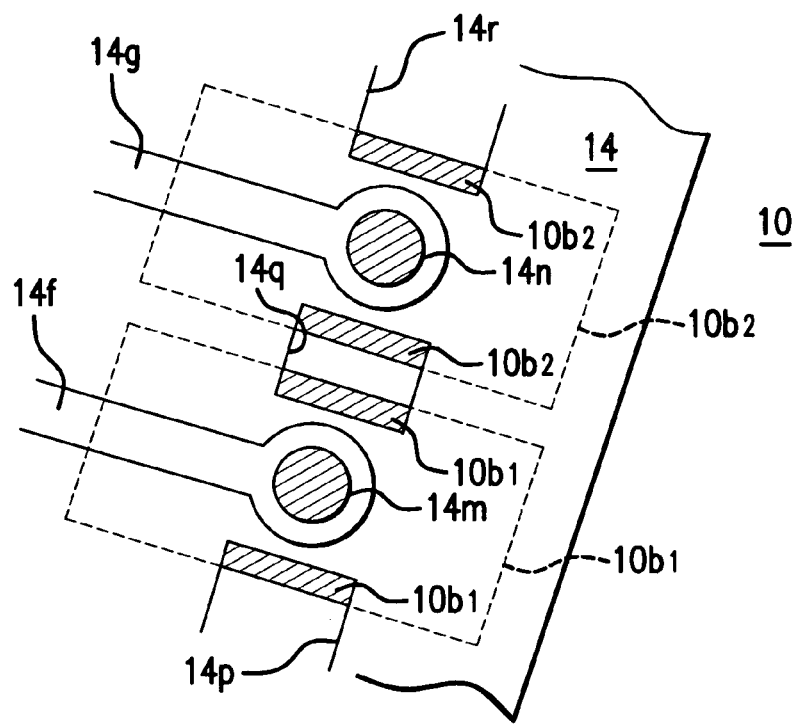
FIG. 10(a) is an enlarged view of portion XA in FIG. 9(b) and FIG. 10(b) is a diagram of the same structure after soldering.

In this case, as shown in enlargement in FIG. 10(a), the corresponding terminals $10b_1$, $10b_2$, $10b_3$, . . . are exposed in the respective confirmation holes 14p, 14q, 14r, . . . . In other words, with the connecting board 14 and the control board 10 partially overlapped, the terminals $10b_1$, $10b_2$, $10b_3$, . . . can be recognized visually through the confirmation holes 14p, 14q, 14r, . . . .

Figure 9B:
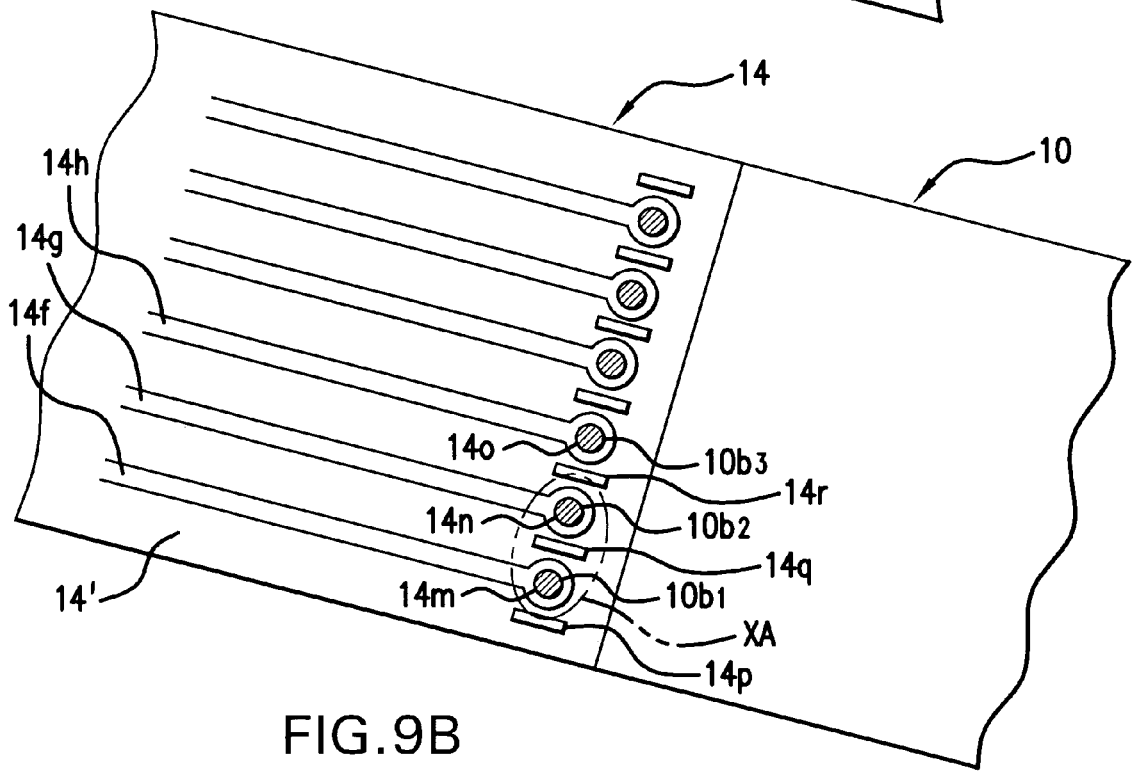
FIG. 9(b) is a diagram showing the same structure after the control board and the connecting board have been bonded together.
Figure 10B:
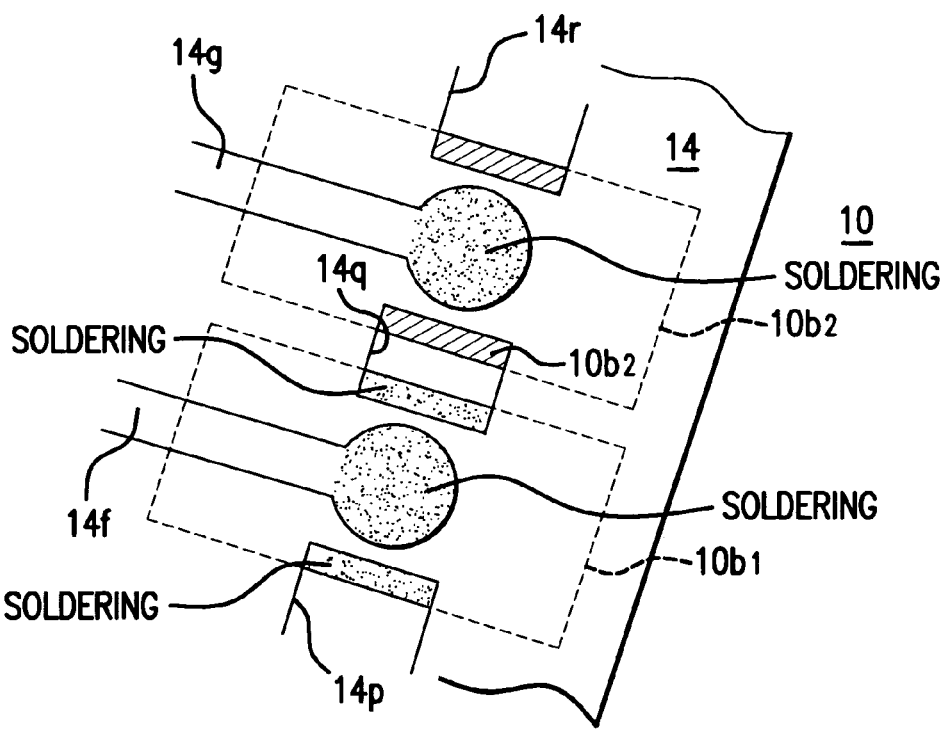

Then, as shown in FIG. 9(b), the control board side through holes 14m, 14n, 14o, . . . and the terminals $10b_1$, $10b_2$, $10b_3$, . . . are joined by soldering through the control board side through holes 14m, 14n, 14o,. At this point, if it is confirmed visually that solder is seeping out, as is the case with the confirmation holes 14p and 14q shown by way of example in FIG. 10(b), then it can be verified that soldering has been achieved sufficiently through hole 14p. If it is confirmed visually that no solder is seeping out, as is the case with the confirmation holes 14q and 14r, it can be verified that soldering has not been sufficiently achieved through hole 14q. Further, it is possible to visually verify that no soldering bridge has been formed between adjacent terminals.

In this way, the terminals 9a, 9b, 9c, . . . of the connector 9 and the terminals $10b_1$, $10b_2$, $10b_3$, . . . of the control board 10 are electrically connected through a circuit pattern in the connecting board 14.

Since, in the control apparatus 1 of the third embodiment, the terminals 9a, 9b, 9c, . . . of the connector 9 for connecting with the vehicle system, the terminals $10b_1$, $10b_2$, $10b_3$, . . . of the control board 10 and the through holes 14$i$, 14$j$, 14$k$, . . . and 14$m$, 14$n$, 14$o$, . . . in the connecting board 14 are joined together by soldering using the connecting board 14 in the form of a flexible printed circuit board, high bonding strength is obtained.

Thus, for the third embodiment, it is not necessary to carry out the kind of strict quality control which is performed in wire bonding for prevention of adherence of contamination to the surface, prevention of oxidation of the surface, surface roughness, i.e., quality control of surface conditions of the terminals 9$a$, 9$b$, 9$c$, . . . of the connector 9, and the terminals $10b_1$, $10b_2$, $10b_3$, . . . of the control board 10. Consequently, labor needed for electrical connection of the terminals 9$a$, 9$b$, 9$c$, . . . of the connector 9, and of the terminals $10b_1$, $10b_2$, $10b_3$, . . . of the control board 10 can be reduced and production cost can also be reduced.

In particular, even if the automatic transmission or the electronic control unit is subjected to engine vibration in the engine compartment, vehicle body vibration during vehicle running or the like, electrical connections between the terminals 9$a$, 9$b$, 9$c$, . . . of the connector 9 and the terminals $10b_1$, $10b_2$, $10b_3$, . . . of the control board 10 remain secure.

Further, since the confirmation holes 14$p$, 14$q$, 14$r$, . . . can be used to check whether the soldering is sufficient, bonding strength of the terminals 9$a$, 9$b$, 9$c$, . . . of the connector 9 and the terminals $10b_1$, $10b_2$, $10b_3$, . . . of the control board 10 with the through holes 14$i$, 14$j$, 14$k$, . . . and 14$m$, 14$n$, 14$o$, . . . is definitely increased. Therefore, even if the electronic control unit is placed under the aforementioned severe environments, electrical connections between the terminals 9$a$, 9$b$, 9$c$ . . . of the connector 9 and the terminals $10b_1$, $10b_2$, $10b_3$, . . . remain secure.

Moreover, since solder enters the punched-out portions, i.e., the through holes, it is difficult for the solder to make a direct contact between adjacent terminals, thereby preventing formation of soldering bridges and preventing short-circuiting.

Other features of the control apparatus 1 of the third embodiment are identical to those of the first and second embodiments.

A fourth embodiment of the present invention will now be described with reference to FIGS. 11($a$)–11($c$). Although in the aforementioned third embodiment, a quantity of control board side through holes 14$m$, 14$n$, 14$o$, . . . are provided in the connecting board 14, and are electrically connected to the terminals $10b_1$, $10b_2$, $10b_3$, . . . on the control board 10, in the fourth embodiment shown in FIGS. 11($a$)–11($c$), the conductors 14$f$, 14$g$, 14$h$, . . . project from an edge of the flexible connecting board 14' and terminals $14f_1$, $14g_1$, $14h_1$, . . . are formed on the projecting conductors. Although four such terminals are shown in FIG. 11, the number is not restricted to four, and the same quantity as the number of conductors on the connecting board 14 can be provided.

Figure 11A:
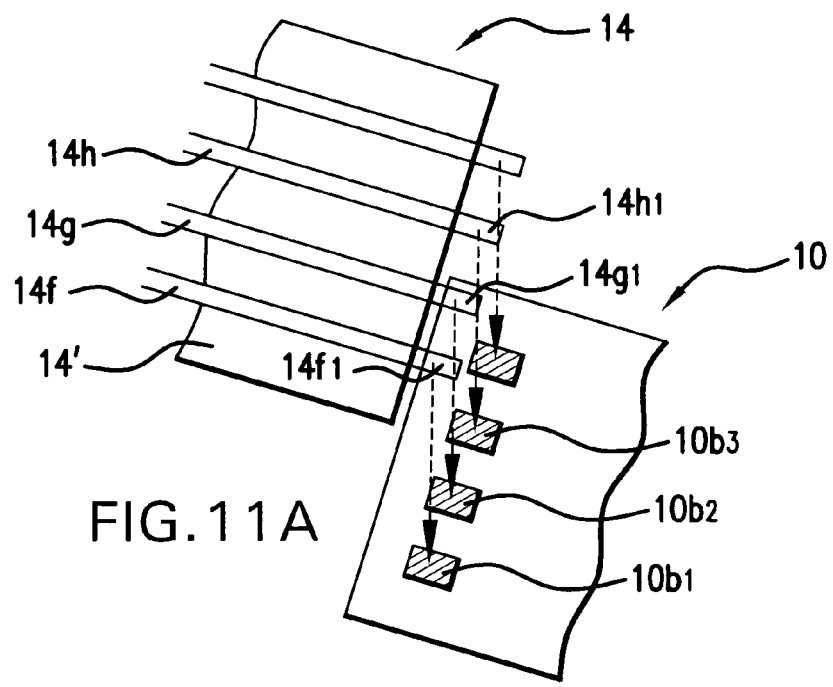
FIG. 11(a) is a schematic diagram, similar to FIG. 9(a), of a fourth embodiment before the control board and the connecting board have been bonded together.
Figure 11B:
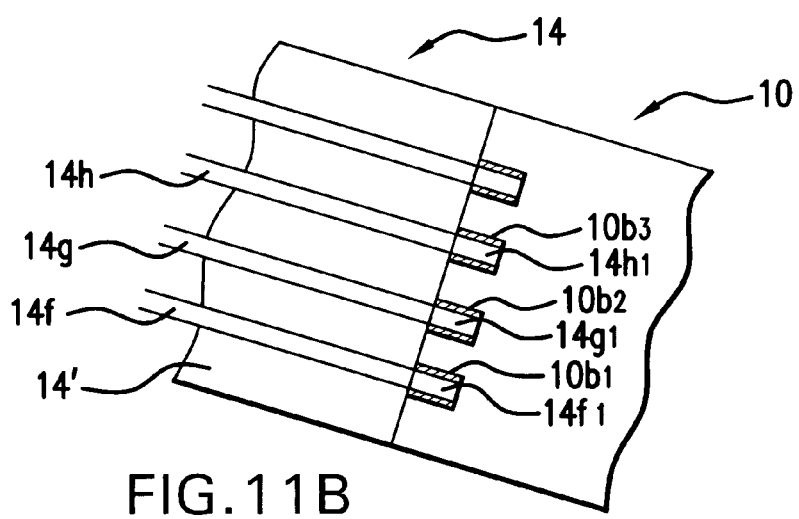
FIG. 11(b) is a schematic diagram, similar to FIG. 9(b), showing the control board and the connecting board bonded together.
Figure 11C:
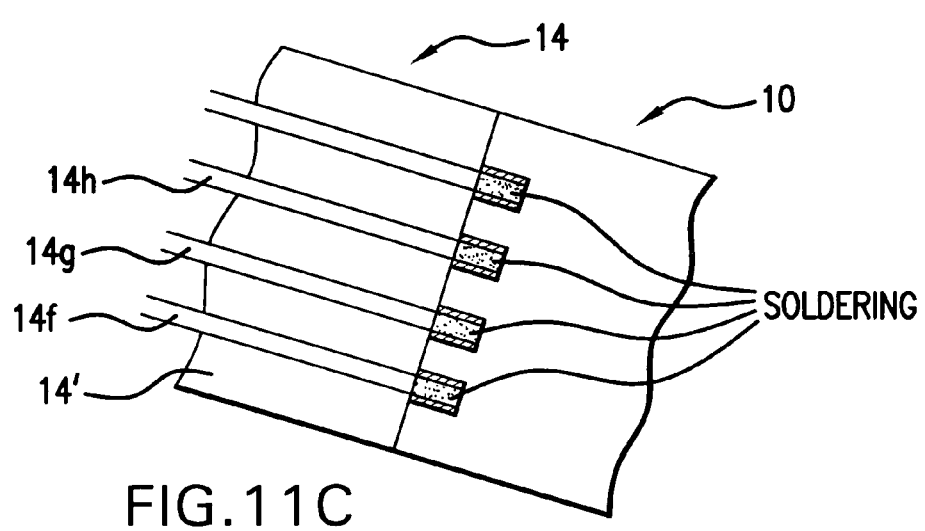

Further, as shown in FIG. 11($a$), the terminals $14f_1$, $14g_1$, $14h_1$, . . . of the connecting board 14 and the terminals $10b_1$, $10b_2$, $10b_3$, . . . of the corresponding control board 10 are matched with each other and then, as shown in FIG. 11($b$), the connecting board 14 and the control board 10 are bonded together. In addition, as shown in FIG. 11 (c), the terminals $14f_1$, $14g_1$, $14h_1$, . . . and the corresponding terminals $10b_1$, $10b_2$, $10b_3$, . . . of the control board 10 are joined together by soldering.

In the fourth embodiment, since soldering is applied directly to the terminals and the terminals are brought into face-to-face contact with each other, high bonding strength can be provided for each terminal.

Other features and effects of the control apparatus 1 according to the fourth embodiment are identical to those of the third embodiment.

Figure 12A:
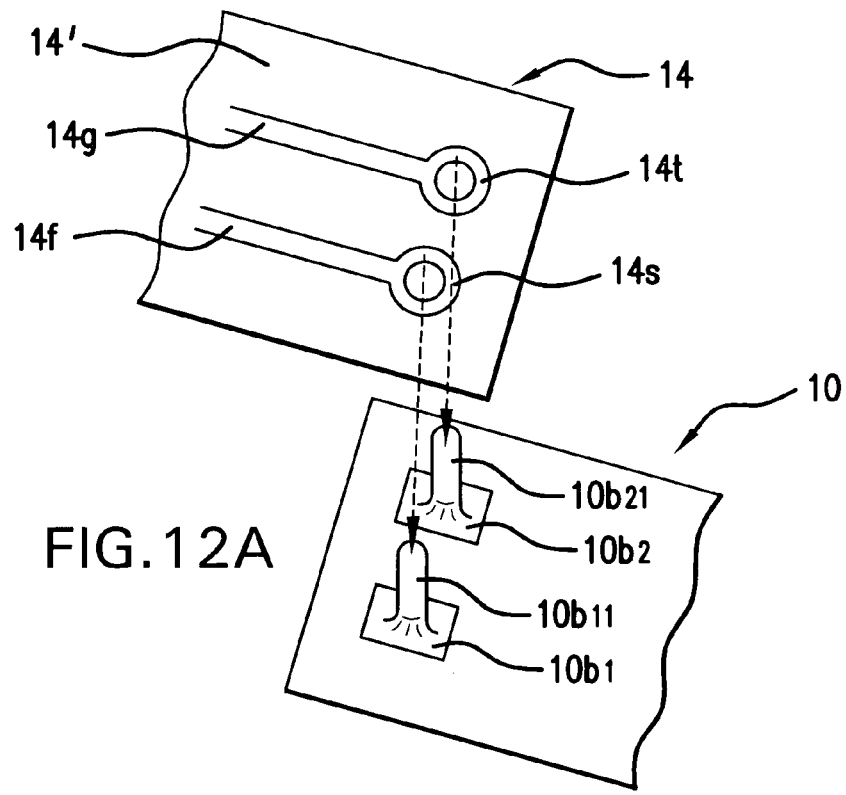
FIG. 12(a) is a schematic diagram, similar to FIG. 11(a), of a fifth embodiment of the present invention, shown in a state before the control board and the connecting board have been bonded together.
Figure 12B:
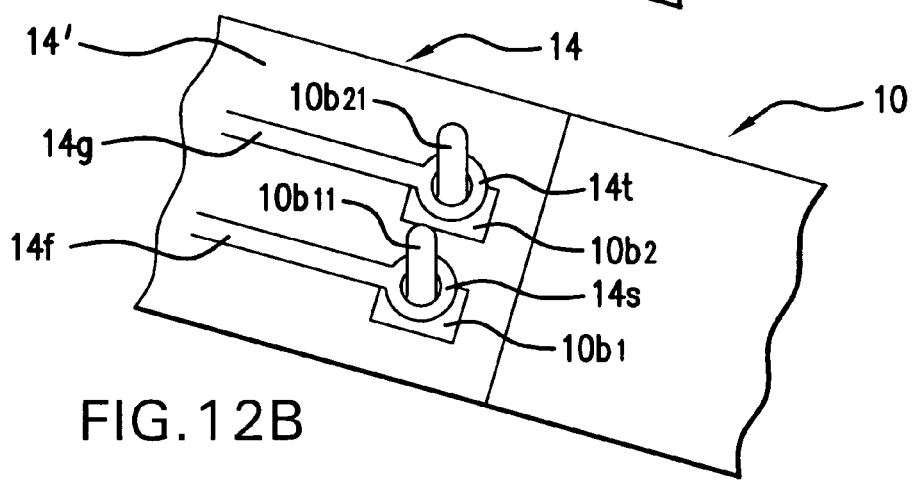
FIG. 12(b) shows the same structure as FIG. 12(a) after the control board and the connecting board have been bonded together.
Figure 12C:
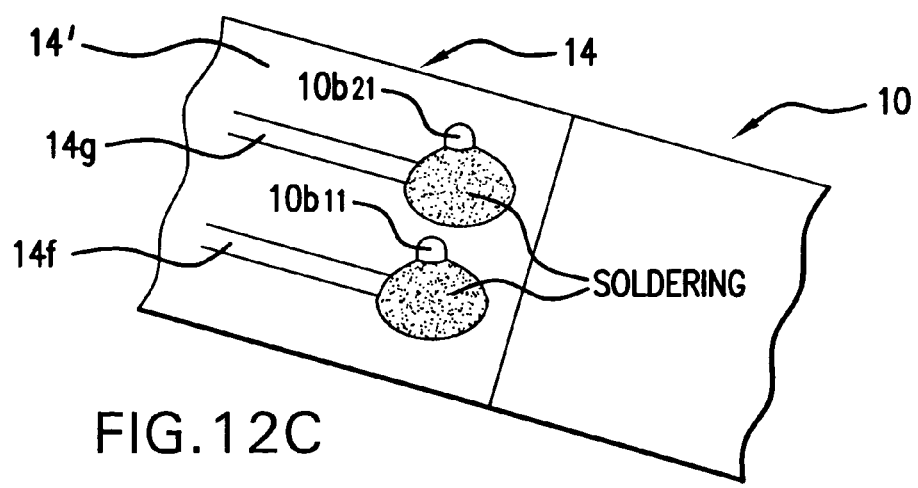
FIG. 12(c) shows the same structure as FIG. 12(b) after soldering.

FIGS. 12($a$)–12($c$) show a fifth embodiment of the present invention. Although in the aforementioned third embodiment, the connecting board 14 is provided with a quantity of the control board side through holes 14$m$, 14$n$, 14$o$, . . . which are electrically connected to the terminals $10b_1$, $10b_2$, $10b_3$, . . . in the fifth embodiment as shown in FIGS. 12($a$)–12($c$), a quantity of lands 14$s$ and 14$t$ is provided instead of the control board side through holes 14$m$, 14$n$, 14$o$, . . . (although two lands 14$s$ and 14$t$ are shown in the example in FIGS. 12($a$)–12($c$), the number is not so restricted and any number may be provided) and through holes ("punched-out portion") are formed in these lands 14$s$ and 14$t$ by punching. Further, the terminals $10b_1$, $10b_2$ of the control board 10 are respectively provided with projecting pins $10b_{11}$ and $10b_{21}$ (the same number as the number of lands 14$s$ and 14$t$).

Further, as shown in FIG. 12($a$), the lands 14$s$ and 14$t$ on the connecting board 14 are matched with the corresponding pins $10b_{11}$ and $10b_{21}$ on the control board 10 and, as shown in FIG. 12($b$), the corresponding pins $10b_{11}$ and $10b_{21}$ are inserted into through holes in the lands 14$a$ and 14$t$, and then the connecting board 14 and the control board 10 are bonded together. As shown in FIG. 12($c$), the respective pins $10b_{11}$ and $10b_{21}$ on the control board 10 corresponding to the lands 14$s$ and 14$t$ are joined with the lands 14$s$ and 14$t$ by soldering.

Since, in the fifth embodiment the pins $10b_{11}$ and $10b_{21}$ are inserted into the through holes in the lands 14$s$ and 14$t$, and soldered, the respective terminals $10b_1$ and $10b_2$, and the lands 14$s$ and 14$t$ can be firmly joined with each other.

Note that in this fifth embodiment only conductive through holes are provided without provision of lands 14$s$ and 14$t$.

Alternatively, the connecting board 14 may be provided with lands identical to the lands 14$s$ and 14$t$ described above, and the connector may be provided with pins identical to the pins $10b_{11}$ and $10b_{21}$, with these joined together in the same way as described above.

Furthermore, the fifth embodiment may also be provided with confirmation holes identical to the confirmation holes 14$p$, 14$q$, . . . of the third embodiment.

Other features and effects of the fifth embodiment are identical to those of the third embodiment.

A sixth embodiment of the present invention will now be described with reference to FIGS. 13($a$)–13($c$). In contrast to the control board side through holes 14$m$, 14$n$, 14$o$, . . . of the third embodiment which are completely circular, in the sixth embodiment shown in FIGS. 13($a$)–13($c$), the control board side through holes 14$m$ and 14$n$ are cut in half into semicircular shapes. Although two control board side through holes 14$m$ and 14$n$ are shown by way of example in FIGS. 13($a$)–13($c$), the number is not so restricted and any number may be provided. Conductive, semi-circular concave portions 14$m$ and 14$n$ are formed at an edge of the connecting board 14. However, note that the concave portions 14$m$ and 14$n$ are not restricted to a semi-circular shape, but may be formed by cutting out a portion of a through hole formed with any sectional shape.

Figure 13A:
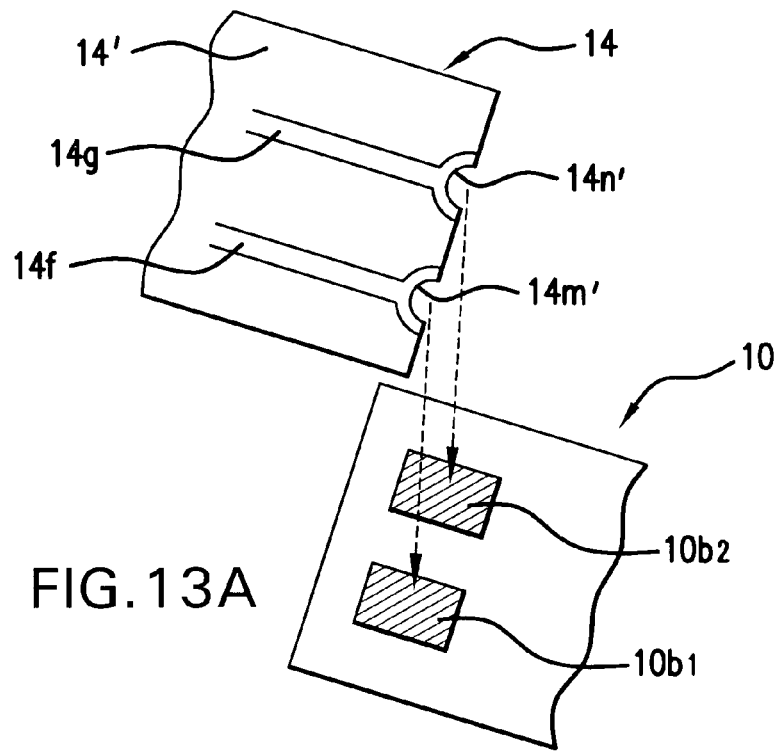
FIG. 13(a) is a schematic diagram, similar to FIG. 11(a) of a sixth embodiment of the present invention, showing the state before the control board and the connecting board have been bonded together.
Figure 13B:
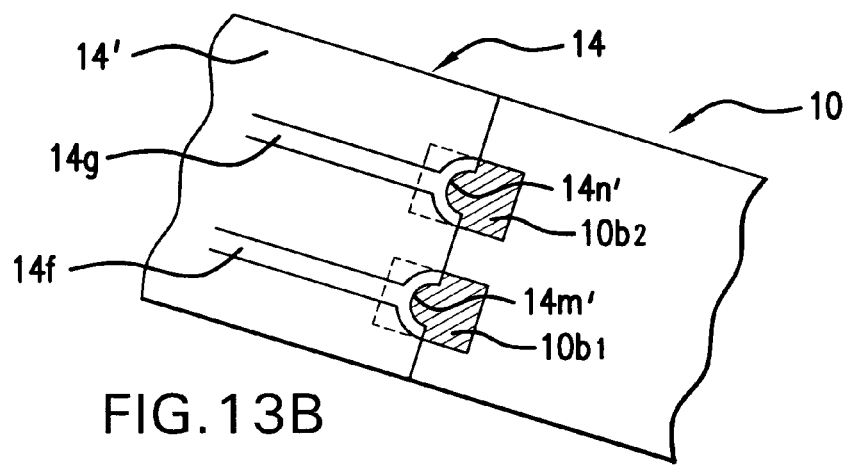
FIG. 13(b) shows the same structure as FIG. 13(a) in the state where the control board and the connecting board have been bonded together.
Figure 13C:
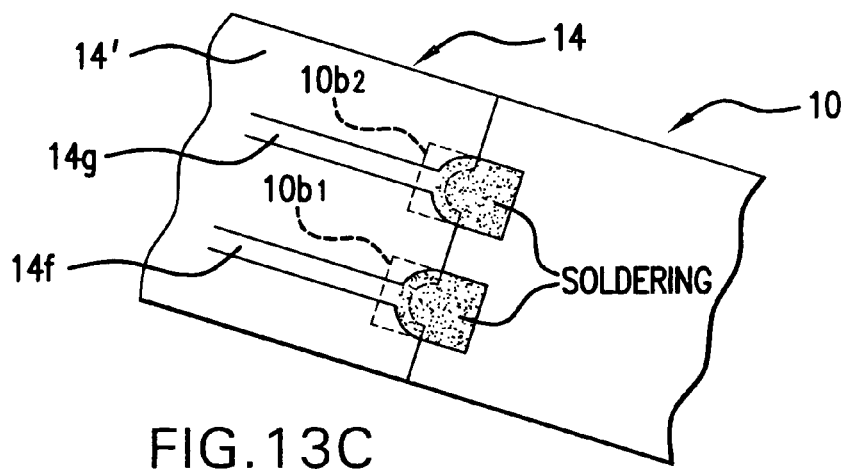
FIG. 13(c) shows the same structure as FIG. 13(b) after soldering.

In addition, as shown in FIG. 13($a$), the positions of the terminals $10b_1$ and $10b_2$ on the control board 10 are aligned with corresponding concave portions 14$m$ and 14$n$ in the connecting board 14 and, as shown in FIG. 13($b$), the connecting board 14 is bonded with the control board 10. Further, as shown in FIG. 13($c$), the terminals $10b_1$ and $10b_2$ on the control board 10 are joined to corresponding concave portions 14m' and 14n' by soldering.

In the control apparatus 1 of the sixth embodiment, by soldering the respective concave portions 14m' and 14n' with the terminals 10b$_1$ and 10b$_2$, they can be firmly joined together.

Further, since the respective concave portions 14m nd 14n are formed by cutting half holes, the concave portions 14m' and 14n' can be easily formed.

Alternatively, the connecting board 14 may also be provided with concave portions identical to concave portions 14m' and 14n' described above, and these may be joined together in the same way as described above.

Further, this sixth embodiment may also be provided with confirmation holes identical to the confirmation holes 14p, 14q, . . . of the third embodiment.

Other features and effects of the ECU 1 of the sixth embodiment are identical to those of the third embodiment.

Figure 14:
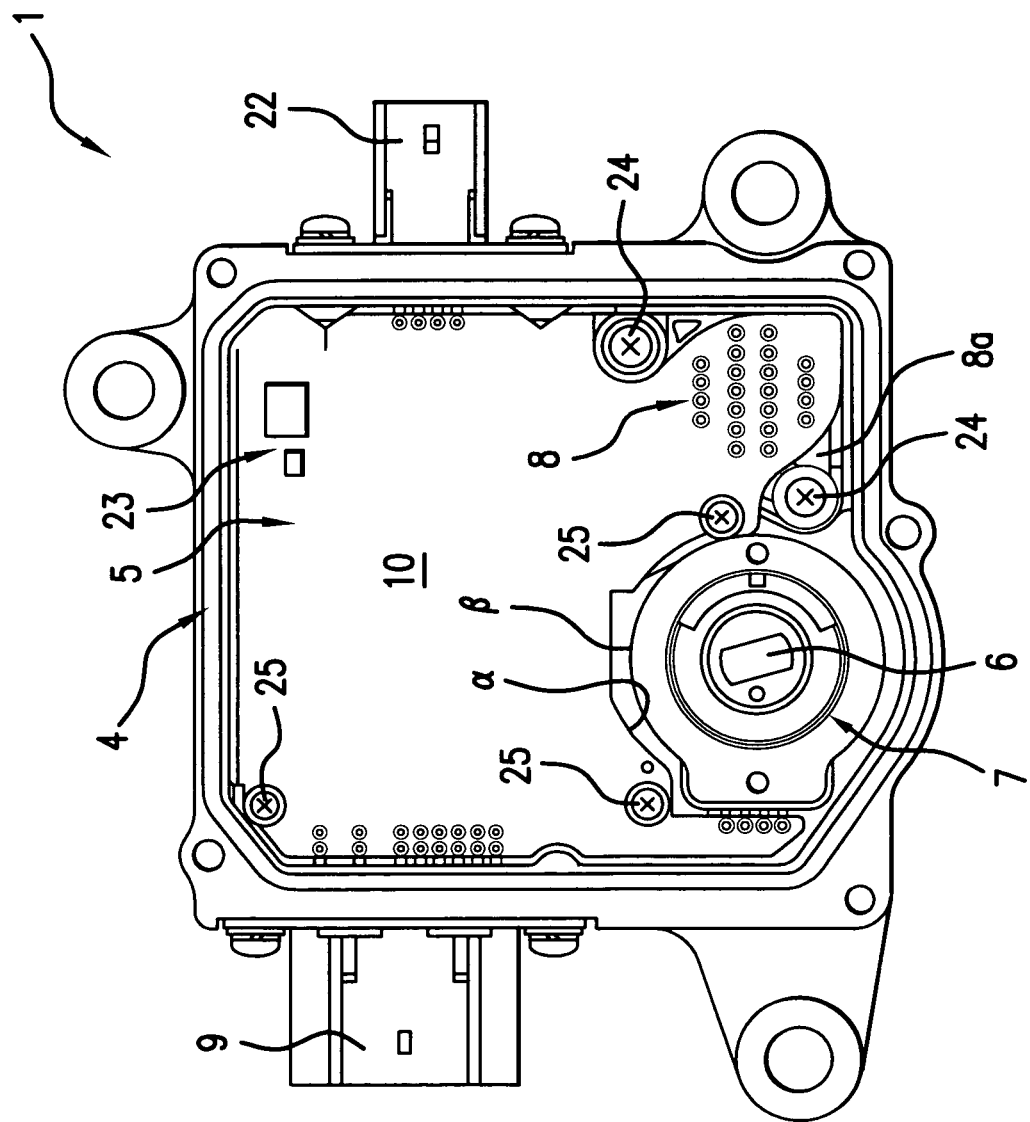
FIG. 14 is a plan view of a seventh embodiment of the control apparatus according to the present invention.
Figure 15:
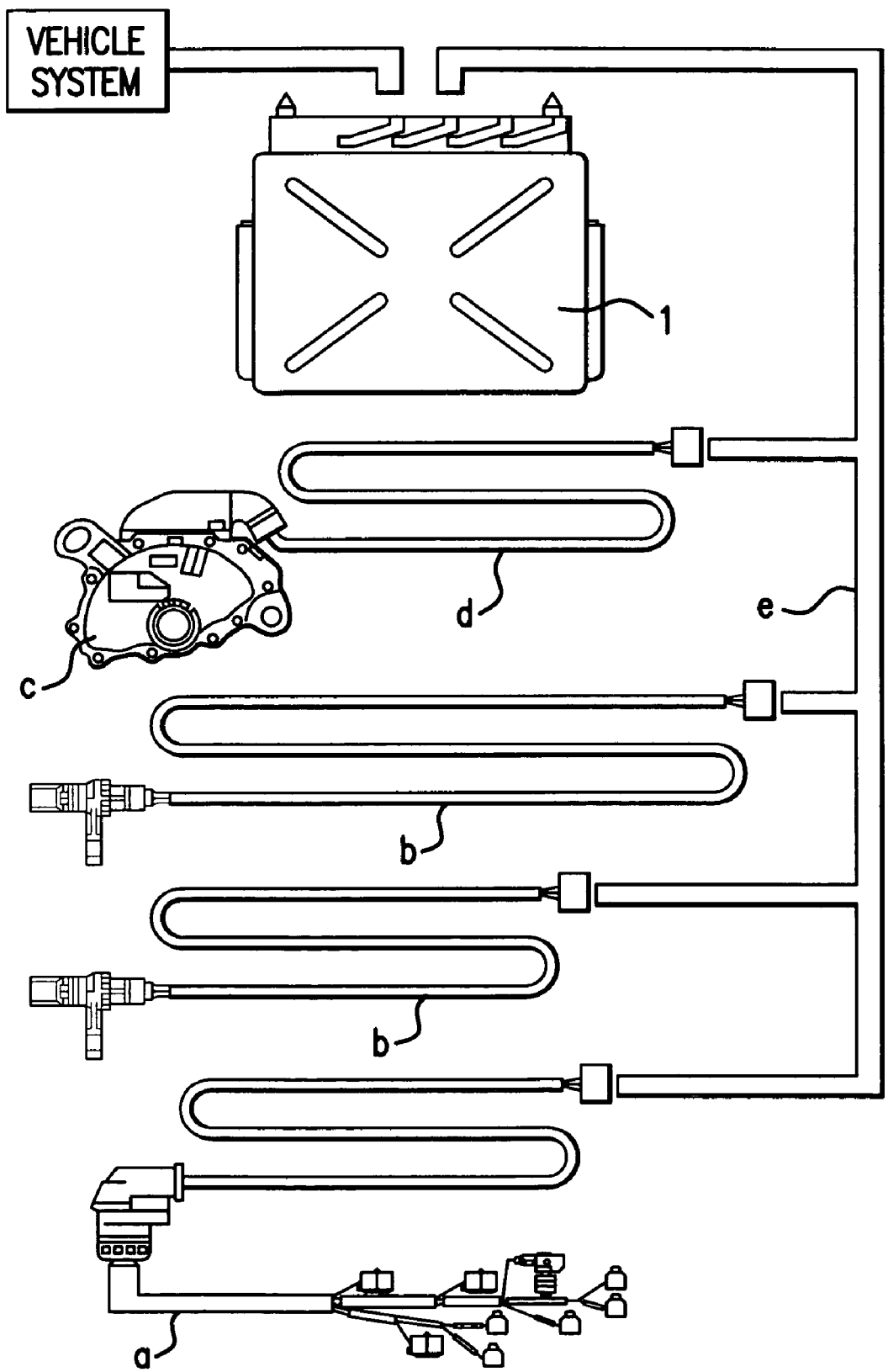
FIG. 15 is a schematic diagram of structure of an electrical connection between an electrical unit and an ECU in a conventional automatic transmission.

FIG. 14 is a plan view of a seventh embodiment of the control apparatus according to the present invention.

In contrast to the first embodiment wherein the connecting board 14 is disposed between the control board 10 and the shift position detecting device 7, in the seventh embodiment as shown in FIG. 14 the connecting board 14 is omitted, and the control board 10 is extended over that area occupied by the connecting board 14 in the first embodiment. This control board 10 is formed of, for example, easy to process material such as glass cloth epoxy board having high heat dissipation capacity and a high heat resistance. A portion α of the control board 10 conforms to the shape of a portion β of the outer shape of the shift position detecting device 7, so that the control board 10 occupies substantially the entire face except for the position occupied by the shift position detecting device 7 within the casing 4. In this way, the space within the casing 4 is without dead space, i.e., efficiently utilized, as in the first embodiment.

The seventh embodiment, instead of the ceramic board, uses a glass cloth epoxy board having a high heat dissipation capacity and heat resistance and thereby reduces cost. Cost is further reduced by omitting the connecting board 14 and thereby reducing the quantity of components.

Other features and effects of the seventh embodiment are identical to those of the first embodiment.

Although in the first and second embodiments, the shift position detecting device 7, the ECU 5 and the connectors 8 and 9 are integrated, the present invention is not necessarily so limited and, alternatively, may be applied to a control apparatus 1 in which at least the shift position detecting device 7 and the ECU 5 control unit are integrated.

Further, although in the first and second embodiments the connecting board 14 conforms to both the shape of the control board 10 and the sectional shape of the shift position detecting device 7, the present invention allows the shape of the connecting board 14 to be formed to conform to any one of these shapes. In particular, the connecting board 14 may be formed into a shape conforming to the quantity of terminals on the output circuit portion 7a of the shift position detecting device 7.

Further, although in the second embodiment, the connecting board which connects the shift position detecting device 7 to the control board 10, and the connecting board which connects the connector 8 to the control board 10 are constructed of a single common connecting board 14d, these connecting functions can be provided by separate connecting boards. In simple terms, the connecting board which connects the shift position detecting device 7 to the control board 10, the connecting board which connects the connector 8 to the control board 10, and the connecting board which connects the connector 9 to the control board 10 may all be provided separately, or two or more of these connecting boards may be integrally formed into a common single board. In this way, by forming two connecting boards into a common single board, not only the quantity of the connecting boards can be reduced, but also, for example when a connecting board is fixed to the casing 4, the quantity of bolts can be reduced, thereby achieving a reduction in cost.

Moreover, although in the first example, the shift position detecting device 7 is formed with a circular section, in the present invention, the output circuit portion 7a may have a projection (not shown) included in the sectional shape of the shift position detecting device, i.e., an elliptical shape or a substantially elliptical shape having a major axis and a minor axis, with the major axis and the long side of the control board 10 arranged in parallel or substantially parallel. Since in this case, the major axis of the sectional shape of the shift position detecting device 7 containing the projection portion and the long side of the control board 10 are parallel or substantially parallel, the shift position detecting device 7 and the ECU 5 can be more effectively disposed in terms of space, thereby enabling the control apparatus 1 to be formed more compact.

Moreover, the electrical connections are not restricted to the aforementioned soldering, and other appropriate electrical connecting means may be used. However, soldering is preferred because it can be carried out easily and securely.

Moreover, the connecting board 14 is not limited to a flexible printed circuit board, but may be any board having a conductive circuit pattern, for example, the aforementioned glass epoxy board or the like.

Moreover, although according to the third to sixth embodiments, the connecting board 14 overlaps the control board 10 in a direction perpendicular with respect to the plane of the substantially planar control board, the output circuit portions 7a and 19a of the shift position detecting device 7, and the connecting board 14 may be arranged to overlap each other in a perpendicular direction in substantially the same plane as in the third to sixth embodiments. Consequently, the same operational effects can also be obtained in the output circuit portions 7a and 19a, and the connecting board 14.

Although the present invention is applied to an A/T in the above-described embodiments, the control apparatus 1 according to the present invention may likewise be applied to the other aforementioned power trains.

Moreover, the shift position detecting device 7 for detecting a change due to a manual operation by the driver is not restricted to detection of a shift position from rotational movement of a movable object such as a rotor, but may be detection of change in shift position from linear motion of a slider or the like.

The invention claimed is:

1. A control apparatus comprising:
    a shift position detecting device for detecting a shift position that is changed by manual operation of a vehicle driver;
    an electronic control unit for controlling a power train responsive to at least one detection signal indicative of a vehicle running state, said electronic control unit comprising a ceramic board on which a plurality of electronic devices are mounted, and wherein the shift position detecting device is connected to the control board through a connecting board; and
    a connector that connects the electronic control unit to an external electrical unit.

2. The control apparatus according to claim 1 wherein the control board is fabricated of a material having a higher heat dissipation capacity than material from which the connecting board is fabricated.

3. The control apparatus according to claim 1 wherein the control board is fabricated of a material having a higher heat resistance than material from which the connecting board is fabricated.

4. The control apparatus according to claim 1 wherein the control board and the connecting board do not overlap in a direction perpendicular to the plane in which the control board is disposed.

5. The control apparatus according to claim 1 wherein the shift position detecting device and the control board do not overlap on the same plane.

6. The control apparatus according to claim 1 wherein the shift position detecting device and the control board do not overlap in a direction perpendicular to the plane in which the control board is disposed.

7. The control apparatus according to claim 1 further comprising a casing housing the shift position detecting device and the control board, said casing having a plane adjusting portion for adjusting at least one of height of the shift position detecting device relative to the connecting board, and height of the connecting board relative to the control board.

8. The control apparatus according to claim 7 wherein the casing has a recess and a projection for mounting the shift position detecting device and the control board.

9. The control apparatus with shift position detecting device according to claim 8 wherein the casing has at least one wall between the shift position detecting device and the control board.

10. The control apparatus according to claim 9 wherein a first wall surrounds the shift position detecting device and a second wall surrounds the control board.

11. The control apparatus according to claim 10 wherein the shift position detecting device is bonded to the casing and to the first wall.

12. The control apparatus according to claim 7 wherein the casing includes a body portion and a cover portion, and wherein the shift position detecting device is held between the body portion and the cover portion.

13. The control apparatus according to claim 12 further comprising a planar seal between the body portion and the cover portion.

14. The control apparatus according to claim 1 wherein the connecting board is a glass cloth epoxy board.

15. The control apparatus according to claim 1 wherein the shift position detecting device is a non-contact type shift position detecting device.

16. The control apparatus according to claim 15 wherein the non-contact type shift position detecting device is provided on a manual shaft, and includes magnetic field generating means in which a generated magnetic field changes in accordance with a manual operation by the vehicle driver, and a sensor, the output of which changes with change in the magnetic field.

17. The control apparatus according to claim 16 further comprising an output circuit for outputting a signal from the sensor, wherein the output circuit is connected to the connecting board.

18. The control apparatus according to claim 17 wherein the output circuit and the connecting board have mutually overlapping portions joined by soldering.

19. The control apparatus according to claim 1 wherein the shift position detecting device is a contact-type shift position detecting device which is provided on a manual shaft and includes a movable contact that moves in accordance with a manual operation by the vehicle driver, and a fixed contact, and detects a shift position as contact or non-contact between the movable contact and the fixed contact.

20. The control apparatus according to claim 19 wherein the contact-type shift position detecting device has an output circuit portion for outputting a signal, and the output circuit is connected with the connecting board.

21. The control apparatus according to claim 20 wherein the output circuit and the connecting board have substantially coplanar and mutually overlapping portions joined by soldering.

22. The control apparatus according to claim 21 wherein the control board and the connecting board overlap have portions which are perpendicular with respect to a plane in which the control board is disposed, which mutually overlap and which are joined by soldering.

23. The control apparatus according to claim 1 wherein said connector portion has a stress absorbing and alleviating portion.

24. A power train including the control apparatus according to claim 1.

25. The control apparatus according to claim 1 wherein the connector includes a first connector portion that connects to an electrical unit within the power train, a second connector portion that connects to an electrical unit within the power tram and a third connector portion that connects to a vehicle system outside the power train.

26. The control apparatus according to claim 25 wherein the control board has a quadrangular shape, and the connecting board is formed in a shape that conforms to the quadrangular shape of the control board.

27. The control apparatus according to claim 26 wherein the connecting board includes a first connecting board portion for connecting the shift position detecting device to the control board, a second connecting board portion for connecting the first connector portion to the control board, and a third connecting board portion for connecting the second connector portion to the control board, and wherein at least two of the connecting board portions are integrated into a common, single board.

28. The control apparatus according to claim 21 wherein the shift position detecting device has an output portion with terminals for outputting a shift position detection signal, and wherein the connecting board is formed in a shape corresponding to the terminals of the output portion.

29. The control apparatus according to claim 28 wherein the first and second connector portions have terminals and wherein the connecting board is formed in a shape corresponding to the quantity of terminals of at least one of the first and second connector portions.

30. The control apparatus according to claim 29 wherein the control board is formed in a rectangular shape having a long side and a short side, and the shift position detecting device and the first connector portion are disposed in the vicinity of the long side while the second connector portion is disposed in the vicinity of the short side.

31. The control apparatus according to claim 30 wherein a connecting portion of the first connector portion and the control unit overlap one side of the shift position detecting device.

32. The control apparatus according to claim 31 wherein the output portion includes a projection that extends from the shift position detecting device, wherein the shift position detecting device including the projection has an elliptical or substantially elliptical sectional shape including a major axis and a minor axis, and wherein the major axis and the long side of the control board are parallel or substantially parallel.

33. The control apparatus according to claim 1 wherein the connector is integrated with the shift position detecting device and the control unit and wherein the control board and the shift position detecting device are connected through a first connecting board, and the control board and the connector are connected through a second connecting board different from the first connecting board.

34. The control apparatus according to claim 1 wherein the connector is electrically connected to the control unit through the connecting board.

35. A control apparatus comprising:
a shift position detecting device for detecting a shift position that is changed by operation of a shift device by a vehicle driver;
a control unit having a control board that includes a plurality of electronic devices for controlling a power train based on at least one detection signal indicative of a vehicle running state;
a casing housing said shift position detecting device; and
a connecting board that connects to and conforms to the shape of at least one of the shift position detecting device and the control unit.

36. The control apparatus according to claim 35 wherein the shift position detecting device has a circular section orthogonal to its axis, and wherein the control board is formed with an external shape having a curvature that conforms to the circular section.

37. The control apparatus according to claim 35 wherein the control board and the shift position detecting device are connected through the connecting board.

38. The control apparatus according to claim 35 having a connector which is integrated with the shift position detecting device and the control unit, and which is connected to an electrical unit located outside the casing, and wherein the connector is connected to the control board though the connecting board.

39. The control apparatus according to claim 38 wherein the connector includes a first connector portion that connects to an electrical unit within the power train and a second connector portion that connects to a vehicle system outside the power train.

40. The control apparatus according to claim 39 wherein the control board has a quadrangular shape, and the connecting board has a shape that conforms to the quadrangular shape of the control board.

41. The control apparatus according to claim 40 wherein the connecting board includes a first connecting board portion for connecting the shift position detecting device to the control board, a second connecting board portion for connecting the first connector portion to the control board, and a third connecting board portion for connecting the second connector portion to the control board, and wherein at least two of the connecting board portions are integrated into a common single board.

42. The control apparatus according to claim 41 wherein the shift position detecting device has an output portion with terminals for outputting a shift position detection signal, and wherein the connecting board is formed in a shape corresponding to the terminals of the output portion.

43. The control apparatus according to claim 42 wherein the connecting board is formed in a shape corresponding to the terminals of at least one of the first and second connector portions.

44. The control apparatus according to claim 43 wherein the control board is formed in a rectangular shape having a long side and a short side, and wherein the shift position detecting device and the first connector portion are disposed in the vicinity of the long side while the second connector portion is disposed in the vicinity of the short side.

45. The control apparatus according to claim 44 wherein a connecting portion of the first connector portion and the control unit overlap one side of the shift position detecting device.

46. The control apparatus according to claim 45 wherein the output portion includes a projection that extends from the shift position detecting device, wherein the shift position detecting device including the projection has an elliptical or substantially elliptical sectional shape including a major axis and a minor axis, and wherein the major axis and the long side of the control board are parallel or substantially parallel.

47. The control apparatus according to claim 35 including a connector which is integrated with the shift position detecting device and the control unit, and is connected to an electrical unit outside the casing, and wherein the control board and the shift position detecting device are connected through a first connecting board, and the control board and the connector are connected through a second connecting board different from the first connecting board.

48. A power train including the control apparatus according to claim 35.

49. A control apparatus comprising:
a shift position detecting device for detecting a shift position that is changed in accordance with operation of a shift device by a vehicle driver;
a control unit having a control board that includes a plurality of electronic devices for controlling a power train based on at least one detection signal indicative of a vehicle running state;
a casing housing the shift position detecting device and the control unit;
a connecting board connecting the shift position detecting device and the control unit; and
wherein a space within the casing, other than that occupied by the control board and the shift position detecting device, is substantially occupied by the connecting board.

50. The control apparatus according to claim 49 wherein the connecting board is fabricated of a material that is easier to process than the material from which the control board is fabricated.

51. The control apparatus according to claim 49 wherein the control board and the shift position detecting device are connected through the connecting board.

52. The control apparatus according to claim 49 having a connector which is integrated with the shift position detecting device and the control unit, which is connected to an electrical unit located outside the casing, and which is connected to the control board through the connecting board.

53. The control apparatus according to claim 52 wherein the connector includes a first connector portion that connects to an electrical unit within the power train and a second connector portion that connects to a vehicle system outside the power train.

54. The control apparatus according to claim 53 wherein the control board has a quadrangular shape, and the connecting board is formed in a shape that conforms to the quadrangular shape of the control board.

55. The control apparatus according to claim 54 wherein the connecting board includes a first connecting board portion for connecting the shift position detecting device to the control board, a second connecting board portion for connecting the first connector portion to the control board, and a third connecting board portion for connecting the second connector portion to the control board, and wherein at least two of the connecting board portions are integrated into a common, single board.

56. The control apparatus according to claim 55 wherein the shift position detecting device has an output portion for outputting a shift position detection signal, and the connecting board has a shape corresponding to terminals of the output portion.

57. The control apparatus according to claim 56 wherein the connecting board has a shape corresponding to terminals of at least one of the first and second connector portions.

58. The control apparatus according to claim 57 wherein the control board has a rectangular shape having a long side and a short side, wherein the shift position detecting device and the first connector portion are disposed in the vicinity of the long side, and wherein the second connector portion is disposed in the vicinity of the short side.

59. The control apparatus according to claim 58 wherein the combination of a connecting portion of the first connector portion and the control unit overlaps one side of the shift position detecting device.

60. The control apparatus according to claim 59 wherein the output portion includes a projection extending from the shift position detecting device, wherein the shift position detecting device including the projection portion has an elliptical or substantially elliptical sectional shape including a major axis and a minor axis, and wherein the major axis and the long side of the control board are parallel or substantially parallel.

61. The control apparatus according to claim 49 including a connector portion which is integrated with the shift position detecting device and the control unit, and is connected to an electrical unit outside the casing,
and wherein the control board and the shift position detecting device are connected through a first connecting board and the control board and the connector portion are connected through a second connecting board different from the first connecting board.

62. A power train including the control apparatus according to claim 49.

63. A control apparatus comprising:
a shift position detecting device for detecting a shift position that is changed in accordance with an operation by a vehicle driver;
a control unit having a control board that includes a plurality of electronic devices for controlling a power train based on at least one detection signal indicative of a vehicle running state;
a casing, housing the shift position detecting device and the control unit; and
a connector portion that connects to an external electrical unit; and
wherein the shift position detecting device and the connector portion are disposed in parallel in the vicinity of one side of the control board.

64. The control apparatus according to claim 63 wherein the control board is a quadrangular ceramic board.

65. The control apparatus according to claim 63 wherein the control board has a quadrangular shape and has a first connector portion that connects to an electrical unit inside the power train and a second connector portion that connects to a vehicle system outside the power train, wherein the shift position detecting device is disposed in parallel with one of the first connector portion and the second connector portion on one side of the quadrangular shape, and wherein the other of the first and second connector portions is disposed on the other side of the quadrangular shape.

66. The control apparatus according to claim 63 wherein the control board is connected to the shift position detecting device through the connecting board.

67. The control apparatus according to claim 26 wherein the connecting board includes a first connecting board portion for connecting the shift position detecting device to the control board, a second connecting board portion for connecting the first connector portion to the control board, and a third connecting board portion for connecting the second connector portion to the control board, and wherein at least two of the connecting board portions are integrated into a common single board.

68. The control apparatus according to claim 67 wherein the shift position detecting device has an output portion for outputting a shift position detection signal, and has a shape corresponding to terminals of the output portion.

69. The control apparatus according to claim 68 wherein the connecting board has a shape corresponding to terminals of at least one of the first and second connector portions.

70. The control apparatus according to claim 69 wherein the control board is rectangular, wherein the shift position detecting device and the first connector portion are disposed in the vicinity of the long side of the rectangle, and wherein the second connector portion is disposed in the vicinity of the short side of the rectangle.

71. The control apparatus according to claim 70 wherein the combination of the connecting portion of the first connector portion and the control unit overlaps one side of the shift position detecting device.

72. The control apparatus according to claim 71 wherein the output portion includes a projection extending from the shift position detecting device, wherein the shift position detecting device including the projection portion has an elliptical or substantially elliptical sectional shape including a major axis and a minor axis, and wherein the major axis and the long side of the control board are parallel or substantially parallel.

73. The control apparatus according to claim 63 wherein the connector portion that connects to an electrical unit outside the casing has a stress absorbing and alleviating portion.

74. A power train including the control apparatus according to claim 63.

* * * * *

UNITED STATES PATENT AND TRADEMARK OFFICE
CERTIFICATE OF CORRECTION

| | |
|---|---|
| PATENT NO. | : 7,178,419 B2 |
| APPLICATION NO. | : 10/489107 |
| DATED | : February 20, 2007 |
| INVENTOR(S) | : Naotaka Murakami et al. |

Page 1 of 1

It is certified that error appears in the above-identified patent and that said Letters Patent is hereby corrected as shown below:

On the title of the Patent, item (56), under the heading "Foreign Patent Documents",
  "JP    44-31890" should read --JP    11-31890 --; and
  "JP  2001-214773" should read --JP    2001-214776--.

Column 22, line 16, (claim 22, line 2), "overlap have" should read -- have overlap --.

Column 22, line 29, (claim 25, line 5), "tram" should read -- train --.

Column 25, line 29 (claim 60, line 4), delete "portion".

Column 26, line 46 (claim 72, line 4), delete "portion".

Signed and Sealed this

Nineteenth Day of June, 2007

JON W. DUDAS
*Director of the United States Patent and Trademark Office*